(12) United States Patent
Takemura

(10) Patent No.: US 9,362,527 B2
(45) Date of Patent: Jun. 7, 2016

(54) FUNCTIONAL FILM HAVING A HYBRID LAYER OF POLYSILOXANE AND FINE RESIN PARTICLES

(71) Applicant: Konica Minolta, Inc., Tokyo (JP)

(72) Inventor: Chiyoko Takemura, Tokyo (JP)

(73) Assignee: Konica Minolta, Inc., Tokyo (JP)

( * ) Notice: Subject to any disclaimer, the term of this patent is extended or adjusted under 35 U.S.C. 154(b) by 32 days.

(21) Appl. No.: 14/378,761

(22) PCT Filed: Feb. 12, 2013

(86) PCT No.: PCT/JP2013/053283
§ 371 (c)(1),
(2) Date: Aug. 14, 2014

(87) PCT Pub. No.: WO2013/122055
PCT Pub. Date: Aug. 22, 2013

(65) Prior Publication Data
US 2016/0013443 A1    Jan. 14, 2016

(30) Foreign Application Priority Data

Feb. 15, 2012    (JP) ................................ 2012-030580

(51) Int. Cl.
*H01L 51/56*    (2006.01)
*H01L 51/52*    (2006.01)
(Continued)

(52) U.S. Cl.
CPC .............. *H01L 51/5253* (2013.01); *C08J 7/04* (2013.01); *H01L 31/03926* (2013.01); *H01L 31/049* (2014.12); *H01L 51/0097* (2013.01); *H01L 51/56* (2013.01); *C08J 2383/04* (2013.01); *H01L 51/524* (2013.01); *H01L 2251/30* (2013.01); *H01L 2251/301* (2013.01);
(Continued)

(58) Field of Classification Search
CPC .................. H01L 2251/301; H01L 2924/0715
See application file for complete search history.

(56) References Cited

U.S. PATENT DOCUMENTS 2,619,443 A * 11/1952 Robinson ................. H01G 4/20
                                                                    156/278
4,259,392 A * 3/1981 Suzuki ..................... G11B 5/716
                                                                    360/135
(Continued)

FOREIGN PATENT DOCUMENTS

CN          101233200 A      7/2008
JP          2003-531745 A    10/2003
(Continued)

OTHER PUBLICATIONS

Office Action issued Aug. 19, 2015, in corresponding Korean Patent Application No. 10-2014-7022375 (with translation) (7 pages).
(Continued)

*Primary Examiner* — Ida M Soward
(74) *Attorney, Agent, or Firm* — Osha Liang LLP

(57) ABSTRACT

To provide a functional film having excellent bending resistance and stability under high temperature and high humidity conditions, a method for producing the same, and an electronic device including the functional film. A functional film including a resin base, a functional inorganic layer arranged on the resin base, and a hybrid layer arranged on at least one surface of the functional inorganic layer, in which the hybrid layer contains a polysiloxane and fine resin particles.

14 Claims, 2 Drawing Sheets

11

(51) Int. Cl.
*H01L 31/00* (2006.01)
*C08J 7/04* (2006.01)
*H01L 51/00* (2006.01)
*H01L 31/049* (2014.01)
*H01L 31/0392* (2006.01)

(52) U.S. Cl.
CPC ............. *H01L 2251/5338* (2013.01); *H01L 2924/0715* (2013.01); *Y02E 10/549* (2013.01); *Y02P 70/521* (2015.11)

(56) References Cited

U.S. PATENT DOCUMENTS

| | | | | |
|---|---|---|---|---|
| 4,319,069 | A * | 3/1982 | Tyan | H01L 21/443 136/258 |
| 4,564,589 | A * | 1/1986 | Hallman | G03F 1/56 430/271.1 |
| 5,593,615 | A * | 1/1997 | Nerad | C09K 19/544 252/299.01 |
| 5,874,187 | A * | 2/1999 | Colvin | G03F 7/001 359/3 |
| 6,231,974 | B1 * | 5/2001 | Yamakawa | C09J 7/0242 257/E21.505 |
| 6,242,862 | B1 * | 6/2001 | Kawakatsu | B01J 35/002 313/493 |
| 2002/0085284 | A1 * | 7/2002 | Nakamura | G02B 1/11 359/601 |
| 2002/0176993 | A1 | 11/2002 | Graff et al. | |
| 2010/0080995 | A1 * | 4/2010 | Ishimatsu | C09J 9/02 428/411.4 |
| 2010/0089636 | A1 | 4/2010 | Ramadas et al. | |
| 2012/0021236 | A1 | 1/2012 | Neumann et al. | |
| 2012/0298497 | A1 * | 11/2012 | Maeda | C09J 133/064 200/600 |

FOREIGN PATENT DOCUMENTS

| | | |
|---|---|---|
| JP | 2008-56967 A | 3/2008 |
| JP | 2009-269217 A | 11/2009 |
| JP | 2009-269218 A | 11/2009 |
| JP | 2010-511267 A | 4/2010 |
| JP | 2012-000546 A | 1/2012 |
| JP | 2012-527361 A | 11/2012 |
| WO | 2007/044181 A2 | 4/2007 |
| WO | 2011/016408 A1 | 2/2011 |

OTHER PUBLICATIONS

Office Action issued May 28, 2015 in corresponding Chinese Patent Application No. 201380009330.0 (with translation) (12 pages).
International Preliminary Report on Patentability and Written Opinion issued in corresponding International Application No. PCT/JP2013/053283 dated Aug. 19, 2014, and English translation thereof (10 pages).
International Search Report issued in corresponding International Application No. PCT/JP2013/053283 dated Apr. 23, 2014, and English translation thereof (6 pages).
Extended European Search Report issued Sep. 18, 2015 in corresponding European Patent Application No. 13749439.9 (8 pages).
Office Action issued Feb. 17, 2016, in corresponding Korean Patent Application No. 10-2014-7022375 (7 pages).
Notification of Second Office Action issued in corresponding Chinese Application No. 201380009330.0, mailed on February 16, 2016 (13 pages).

* cited by examiner

FUNCTIONAL FILM HAVING A HYBRID LAYER OF POLYSILOXANE AND FINE RESIN PARTICLES

TECHNICAL FIELD

The present invention relates to a functional film, a method for producing the same, and an electronic device including the functional film.

BACKGROUND ART

Conventionally, a gas barrier film including a relatively simple structure in which an inorganic film such as a vapor-deposited film of a metal or metal oxide is formed on the surface of a resin base to prevent permeation of water vapor or gases such as oxygen has been used in the field of food products, packaging materials, pharmaceutical products, or the like.

Recently, a gas barrier film for preventing permeation of water vapor, oxygen, or the like is also used in the field of an electronic device such as a liquid crystal display (LCD) element, a photovoltaic (PV) cell, and an organic electroluminescence (EL). Specifically, since those electronic devices are required to be provided with flexibility, light weightiness, and non-breakability, a gas barrier film having those properties has been used.

As a method for obtaining the gas barrier film which can be applied to an electronic device, a method of forming a thickened inorganic film on a resin base can be mentioned. However, by thickening an inorganic film only, a sufficient gas barrier property cannot be obtained as defects such as a crack are easily generated on the inorganic film. Accordingly, a gas barrier film including an organic film formed as an adhesion layer to prevent generation of a crack in a thickened inorganic film, specifically, a gas barrier film produced by alternately laminating a unit consisting of an inorganic film and an organic film is suggested (Patent Literatures 1 and 2).

CITATION LIST

Patent Literature

Patent Literature 1: Japanese PCT National Publication No. 2003-531745
Patent Literature 2: Japanese PCT National Publication No. 2010-511267

SUMMARY OF INVENTION

Technical Problem

However, when the gas barrier film described in Patent Literatures 1 and 2 is applied to an electronic device, it was found that the performances are not necessarily sufficient. Specifically, because the gas barrier film requiring the flexibility has a significantly different film hardness between the resin base and the organic film and inorganic film, peeling or a crack may occur in the inorganic film at the time of bending the resin base. Further, because the electronic device may be placed in an environment of high temperature and high humidity. Under such environment, the resin base, the organic film, and the inorganic film change the shape with individually different expansion ratio and shrinkage ratio, and thus the layer configuration may be disrupted. Further, as a result of elution of a low molecular compound from the resin base or the organic layer, the adhesion property between layers is further lowered so that the performances of the inorganic film may be deteriorated.

Under the circumstances, a purpose of the present invention is to provide a functional film such as a gas barrier film having excellent bending resistance and stability under high temperature and high humidity conditions, a method for producing the same, and an electronic device including the functional film.

Solution to Problem

As a result of performing intensive studies, the inventors of the present invention found that the aforementioned problems can be solved by using a hybrid layer containing polysiloxane and fine resin particles in a functional film, and completed the present invention accordingly.

The aforementioned purpose of the present invention is achieved by the following means.

1. A functional film including a resin base, a functional inorganic layer that is arranged on the resin base, and a hybrid layer that is arranged on at least one surface of the functional inorganic layer, in which the hybrid layer contains polysiloxane and fine resin particles;
2. The functional film described in item 1, in which the hybrid layer is disposed between the resin base and the functional inorganic layer;
3. The functional film described in item 1 or 2, in which the hybrid layer is arranged on a surface of the functional inorganic layer, wherein the surface of the functional inorganic layer is opposite to the resin base;
4. The functional film described in any one of items 1 to 3, in which the functional film has a functional inorganic layer produced by laminating two or more layers;
5. The functional film described in any one of items 1 to 4, in which a ratio of a film thickness of the functional inorganic layer compared to a film thickness of the hybrid layer (film thickness of functional inorganic layer/film thickness of hybrid layer) is 0.001 to 10;
6. The functional film described in any one of items 1 to 5, in which the functional film has, on both surfaces of the resin base, the functional inorganic layer and the hybrid layer that is arranged on at least one surface of the functional inorganic layer;
7. The functional film described in any one of items 1 to 6, in which the functional inorganic layer is an inorganic layer with a gas barrier property;
8. A method for producing a functional film including a resin base, a functional inorganic layer that is arranged on the resin base, and a hybrid layer that is arranged on at least one surface of the functional inorganic layer, the method including Step (1) of forming the hybrid layer by coating a first coating liquid containing polysiloxane and fine resin particles;
9. The production method described in item 8, further including Step (2) of forming the functional inorganic layer by forming a coating film according to coating of a second coating liquid containing an inorganic precursor and by performing a modification treatment of the coating film;
10. The production method described in item 9, in which the inorganic precursor contains polysilazane;
11. The production method described in item 9 or 10, in which the modification treatment is performed by vacuum ultraviolet ray irradiation;
12. An electronic device including a main body of an electronic device and the functional film described in any one of items 1 to 7, or the functional film produced by the method described in any one of items 8 to 11;

13. The electronic device described in item 12, in which the main body of the electronic device is obtained by sealing with the functional film.

Effect of Invention

According to the present invention, it is possible to provide a functional film having excellent bending resistance and stability under high temperature and high humidity conditions, a method for producing the same, and an electronic device including the functional film.

DESCRIPTION OF EMBODIMENTS

Figure 1:
FIG. 1 is a schematic diagram of a cross-section illustrating diagrammatically a functional film according to a first embodiment.

Hereinbelow, the embodiments for carrying out the present invention are described in detail.

First Embodiment

Functional Film

According to the first embodiment of the present invention, a functional film including a resin base, a functional inorganic layer that is arranged on the resin base, and a hybrid layer that is arranged on at least one surface of the functional inorganic layer is provided. In that case, the hybrid layer contains polysiloxane and fine resin particles.

Hereinbelow, the embodiments of the present invention are described in view of the drawings, but the technical scope of the present invention should be determined on the basis of the Claims and it is not limited to the embodiments that are described below. Meanwhile, the size ratio in the drawings is exaggerated for the sake of description, and it may be different from an actual ratio.

[Functional Film]

FIG. 1 is a schematic diagram of a cross-section illustrating diagrammatically the functional film according to the first embodiment. According to FIG. 1, the functional film 11 according to the first embodiment includes a resin base 12 that is arranged on one surface of a bleed out preventing layer (not illustrated), a hybrid layer 13 that is arranged on the opposite surface of the bleed out preventing layer, and a functional inorganic layer 14 that is arranged on the hybrid layer 13. The hybrid layer 13 includes polysiloxane and fine resin particles. Further, the functional inorganic layer 14 includes silicon oxide, and/or silicon oxynitride. The functional inorganic layer 14 is an inorganic layer with a gas barrier property which has a gas barrier property. Thus, the functional film 11 according to the first embodiment is a gas barrier film.

Figure 2:
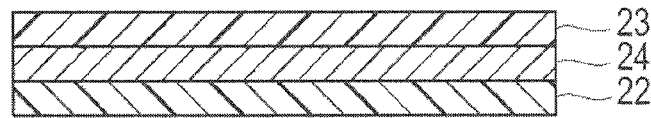
FIG. 2 is a schematic diagram of a cross-section illustrating diagrammatically a functional film according to a second embodiment.

FIG. 2 is a schematic diagram of a cross-section illustrating diagrammatically the functional film according to the second embodiment. According to FIG. 2, a functional film 21 according to the second embodiment has a resin base 22 consisting of a polyester film on one surface of which a bleed out preventing layer (not illustrated) is arranged, a functional inorganic layer 24 that is arranged on the opposite surface of the bleed out preventing layer, and the hybrid layer 23 that is arranged on the functional inorganic layer 24. The hybrid layer 23 and the functional inorganic layer 24 have the same constitution as the first embodiment, and therefore the functional film 21 according to the second embodiment is also a gas barrier film.

Figure 3:
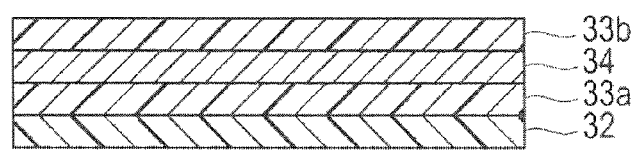
FIG. 3 is a schematic diagram of a cross-section illustrating diagrammatically a functional film according to a third embodiment.

FIG. 3 is a schematic diagram of a cross-section illustrating diagrammatically the functional film according to the third embodiment. According to FIG. 3, a functional film 31 according to the second embodiment has a resin base 32 consisting of a polyester film on one surface of which a bleed out preventing layer (not illustrated) is arranged, a hybrid layer 33a that is arranged on the opposite surface of the bleed out preventing layer, a functional inorganic layer 34 that is arranged on the hybrid layer 33a, and the hybrid layer 33b that is arranged on the functional inorganic layer 34. The hybrid layer 33a and the functional inorganic layer 34 have the same constitution as the first embodiment and the hybrid layer 33b has the same constitution as the hybrid layer 33a, and therefore the functional film 31 according to the third embodiment is also a gas barrier film.

Each of the functional films according to the first to the third embodiments mentioned above may additionally have, on a surface opposite to the surface on which the functional inorganic layer of a resin base and the hybrid layer are arranged, the functional inorganic layer and the hybrid layer that are selected from a group consisting of the first to the third embodiments.

By having a hybrid layer between the resin base and the functional inorganic layer and/or on a surface of the functional inorganic layer, excellent bending resistance and stability under high temperature and high humidity conditions can be obtained.

Hereinbelow, constitution of each functional film of the first to the third embodiments is described in detail.

[Resin Base]

It is desirable that the resin base according to the present invention be, although not particularly limited, a bendable film base having flexibility and permeability.

Specific examples of the resin base may include resin films of acrylic acid ester, methacrylic acid ester, polyethylene terephthalate (PET), polybutylene terephthalate, polyethylene naphthalate (PEN), polycarbonate (PC), polyarylate, polyvinyl chloride (PVC), polyethylene (PE), polypropylene (PP), polystyrene (PS), nylon (Ny), aromatic polyamide, polyether ether ketone, polysulfone, polyether sulfone, polyimide, polyether imide and the like; a heat resistant transparent film having, as a basic skeleton, silsesquioxane having an organic inorganic hybrid structure (Sila-DEC; manufactured by CHISSO Corporation), and the like. Among them, polyethylene terephthalate (PET), polybutylene terephthalate, polyethylene naphthalate (PEN), and polycarbonate (PC) are preferably used in terms of costs and ease of acquisition. Further, in terms of optical transparency, heat resistance, or the like, a heat resistant transparent film having, as a basic skeleton, silsesquioxane having an organic inorganic hybrid structure is preferably used. The base can be used either singly or in combination of two or more types.

Further, the resin base using the aforementioned resin film may be either an unstretched film or a stretched film.

The resin base using the aforementioned resin film can be produced by a previously well-known general method. For example, by melting a resin as a material by an extruder, and extruding the molten resin through a ring die or a T die to be rapidly cooled, an unstretched film, which is substantially amorphous and is not oriented, can be produced. Furthermore, a stretched film can be produced by stretching the unstretched film in a resin base-flowing direction (longitudinal direction) or a direction perpendicular to the resin base-flowing direction (lateral direction) by a known method such as uniaxial stretching, tenter type sequential biaxial stretching, tenter type simultaneous biaxial stretching, or tubular type simultaneous biaxial stretching. The stretching ratio in this case can be appropriately selected according to a resin as a raw material of the resin base, but it is preferably 2 times to 10 times in each of longitudinal and lateral directions.

The thickness of the resin base used in the present invention is preferably 5 to 500 µm, and more preferably 25 to 250 µm.

Further, the resin base used in the present invention is preferably transparent. That is because, when the resin base is transparent, it becomes possible to have a transparent functional film and it also becomes possible to apply the resin base to a substrate of an electronic device such as photoelectric conversion element (solar cell).

The resin base used in the present invention preferably has the linear expansion coefficient of 50 ppm/° C. or less, and 1 to 50 ppm/° C. is preferable. When the linear expansion coefficient of the resin base is 50 ppm/° C. or less, an occurrence of color deviation caused by environmental temperature change or deformation of the resin base can be suppressed when a functional barrier film is applied to an electronic device such as a liquid display device (LCD panel), and therefore preferable. Meanwhile, the "linear expansion coefficient" as described herein employs the value that is measured by the following method. Specifically, by using a thermal stress-strain measuring device, EXSTAR TMA/SS6000 type (manufactured by Seiko Instruments Inc.), the base to be measured is heated to 30 to 50° C. at a rate of 5° C./minute under a nitrogen atmosphere, and then held temporarily at the same temperature. After that, it is heated to 30 to 150° C. again at a rate of 5° C./minute, and the change in size of the base is measured at elongation mode (load of 5 g). The linear expansion coefficient is obtained from the resulting value.

The visible light (400 nm to 700 nm) transmittance of the resin base according to the present invention is preferably 80% or more, and more preferably 90% or more. When the light transmittance is 80% or more, high brightness can be obtained when the functional barrier film is applied to an electronic device such as a liquid crystal display device (LCD panel), and therefore preferable. Meanwhile, "light transmittance" described herein means an average transmittance in the visible light region, which is obtained by measuring the total amount of transmitted light to the amount of incident light of visible light in accordance with ASTM D-1003 standard by using a spectrophotometer (ultraviolet visible spectrophotometer, UV-2500PC: manufactured by Shimadzu Corporation).

The resin base according to the present invention may be treated with a corona treatment.

Further, the resin base according to the present invention may be suitably formed with other layer (intermediate layer). For example, for the purpose of enhancing the adhesive property of the hybrid layer or the like to the surface of the resin base, an anchor coat layer (easy adhesion layer) can be formed. With regard to the anchor coating agent which can be used, although not particularly limited, a silane coupling agent is preferably used from the viewpoint of forming a thin film at single molecule level to nano level and obtaining a high adhesion property by forming a molecular bond at a layer interface. In addition to them, a stress alleviating layer including a resin or the like, a smooth layer for smoothening the surface of the resin base, or a bleed out preventing layer for preventing bleed out from the resin base, or the like can be formed.

Further, for the purpose of adjusting curl balance of the functional inorganic layer or improving the process resistance for producing a device or handling adaptability or the like, a back coat layer may be formed on the resin base.

[Functional Inorganic Layer]

The functional inorganic layer gives a predetermined function to a functional film. For example, when the functional inorganic layer is an inorganic layer with a gas barrier property, the functional film can be a gas barrier film having a gas barrier property. Further, examples of the functional inorganic layer other than the inorganic layer with a gas barrier property include a transparent conductive inorganic layer such as ITO, a heat-blocking inorganic layer laminated with $SiO_2$ or $TiO_2$, an electrode inorganic layer including such as a metal or metal oxide, an interlayer insulating inorganic layer such as $SiO_2$, a gate insulating layer such as $SiO_2$, an inorganic layer of oxide semiconductor such as transparent amorphous oxide semiconductor (TAOS), a silver-deposited layer, and a multilayer film having different refractive indices. The functional inorganic layer can be used for a touch panel, a flexible print board, a thin film transistor, various displays, a back light, a reflective panel, a diffusion reflection film for polarizing plate, an anti-reflection film, or the like.

In the descriptions given below, the inorganic layer with a gas barrier property is described in detail. However, the technical scope of the present invention is not limited to the following specific examples.

(Inorganic Layer with a Gas Barrier Property)

The inorganic layer with a gas barrier property has a function of providing the functional film with a gas barrier property. Meanwhile, as described herein, the "gas barrier property" indicates that the water vapor permeability (temperature: 60±0.5° C., and relative humidity (RH): 90±2%) measured according to the method based on JIS K 7129-1992 is $3 \times 10^{-3}$ g/(m$^2 \cdot$24 h) or less and the oxygen permeability measured according to the method based on JIS K 7126-1987 is $1 \times 10^{-3}$ mL/m$^2 \cdot$24 h·atm or less.

The inorganic layer with a gas barrier property is not particularly limited as long as the inorganic layer has a gas barrier property. For example, an inorganic matter obtained by a modification treatment of an inorganic precursor is included. As for the inorganic precursor, polysilazane is preferably used.

Polysilazane

Polysilazane is a polymer having a bond such as Si—N, Si—H, and N—H in its structure, and it functions as an inorganic precursor of $SiO_2$, $Si_3N_4$, and its intermediate solid solution $SiO_xN_y$ or the like.

Although the polysilazane is not particularly limited, considering that it is subjected to a modification treatment, a compound which is modified into silica according to ceramization at relatively low temperature is preferable. For example, a compound having a main skeleton including the unit represented by the following formula as described in Japanese Patent Application Laid-Open No. H8-112879 is preferable.

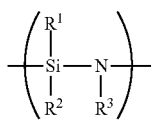

In the above formula, $R^1$, $R^2$, and $R^3$ each independently represents a hydrogen atom, an alkyl group, an alkenyl group, a cycloalkyl group, an aryl group, an alkylsilyl group, an alkylamino group, or an alkoxy group.

From the viewpoint of density of the inorganic layer with a gas barrier property to be obtained, polysilazane is particularly preferably perhydropolysilazane (hereinbelow, also referred to as "PHPS") in which all of $R^1$, $R^2$, and $R^3$ are a hydrogen atom.

Perhydropolysilazane is believed to be a structure having a linear structure and a cyclic structure in which a 6-membered ring and an 8-membered ring are present at center. The molecular weight is, in terms of the number average molecular weight (Mn), about 600 to 2000 (with reference to polystyrene), and depending on the molecular weight, it can be either a liquid or a solid material. A commercially available product can be used as the perhydropolysilazane, and examples of the commercially available product include AQUAMICANN120, NN110, NAX120, NAX110, NL120A, NL110A, NL150A, NP110, and NP140 (manufactured by AZ Electronic Materials).

Another examples of polysilazane which undergoes ceramization at low temperature include silicon alkoxide added polysilazane, being produced by reacting silicon alkoxide with polysilazane represented by the above-described formula (for example, refer to Japanese Patent Application Laid-Open No. H5-238827); glycidol added polysilazane, being produced by reacting glycidol (for example, refer to Japanese Patent Application Laid-Open No. H6-122852); alcohol added polysilazane, being produced by reacting alcohol (for example, refer to Japanese Patent Application Laid-Open No. H6-240208); metal carboxylic acid added polysilazane, being produced by reacting metal carboxylate (for example, refer to Japanese Patent Application Laid-Open No. H6-299118); acetyl acetonate complex added polysilazane, being produced by reacting acetyl acetonate complex containing a metal (for example, refer to Japanese Patent Application Laid-Open No. H6-306329); and metal fine particle added polysilazane, being produced by adding metal fine particles (for example, refer to Japanese Patent Application Laid-Open No. 7-196986).

Inorganic Matter

The inorganic matter is not particularly limited as long as it has a gas barrier property. However, the inorganic matter produced by a modification treatment of the polysilazane, for example, silicone oxide, silicon nitride, and silicon oxynitride are preferable. Since the inorganic matter obtained by a modification treatment of polysilazane forms a denser inorganic layer with a gas barrier property, it can have a higher barrier property.

The inorganic layer with a gas barrier property can be either a monolayer or a laminate of two or more layers, but it is preferably a laminate of two or more layers. With the inorganic layer with a gas barrier property obtained by laminating two or more layers, permeation of water vapor caused by defects, which may be present from the beginning of the gas barrier film production, can be prevented. Meanwhile, when two or more layers of the inorganic layer with a gas barrier property are laminated, each layer may include the same component or it may be a layer including different component. Further, the inorganic layer with a gas barrier property may be formed on both surfaces of the base.

The film thickness of the inorganic layer with a gas barrier property is preferably 1 nm to 10 μm, more preferably 10 nm to 5000 μm, and most preferably 100 to 1000 nm. The inorganic layer with a gas barrier property is preferably 1 nm or more, in terms of possibly have a sufficient gas barrier property. On the other hand, the inorganic layer with a gas barrier property is preferably 10 μm or less, in terms of preventing the inorganic layer with a gas barrier property from having an occurrence of cracks. Meanwhile, when the inorganic layer with a gas barrier property is obtained by laminating two or more layers, the total film thickness is preferably within the aforementioned range. Further, when the inorganic layers with a gas barrier property are formed on both surfaces, thickness of each film is preferably within the aforementioned range.

[Hybrid Layer]

The hybrid layer has a function of providing the functional inorganic layer with bending resistance and stability under high temperature and high humidity conditions. The hybrid layer contains polysiloxane and fine resin particles.

(Polysiloxane)

Polysiloxane has a function of providing the hybrid layer with certain heat resistance and film strength.

Polysiloxane which can be used is, although not particularly limited, preferably polysiloxane generated from an alkoxysilane compound or a polyalkoxysilane compound.

The alkoxysilane compound is, although not particularly limited, is generally an alkoxysilane compound not containing an amino group and an epoxy group, and it is preferable to use a compound represented by the following formula (1).

[Chem. 2]

$$(R^4)_m Si(OR^5)_{(4-m)} \qquad (1)$$

In the above formula, each $R^4$ may be the same or different from each other and it is a C1 to C6 alkyl group substituted with a substituent group selected from a group consisting of a C1 to C6 alkyl group, an alkenyl group such as vinyl group, an aryl group such as a phenyl group, a methacryloxy group, an isocyanate group, an ureido group, and a halogen atom, $R^5$ is a C1 to C4 alkyl group, and m is 0, 1, or 2. Among them, a bifunctional alkoxysilane in which m in the formula (1) is 2 is preferably used. A trifunctional alkoxysilane in which m is 1 and a tetrafunctional alkoxysilane in which m is 0 are more preferably used.

Examples of the trifunctional alkoxysilane include, although not particularly limited, methyltrimethoxysilane, methyltriethoxysilane, ethyltrimethoxysilane, ethyltriethoxysilane, hexyltrimethoxysilane, phenyltrimethoxysilane, phenyltriethoxysilane, vinyltrimethoxysilane, vinyltriethoxysilane, γ-methacryloxypropyltrimethoxysilane, 3-isocyanate propyltrimethoxysilane, blocked isocyanate trimethoxysilane in which the isocyanate group is blocked with 2-butanoxime or the like, ureidopropyltriethoxysilane, trifluoropropyltrimethoxysilane, and trifluoropropyltriethoxysilane.

Examples of the tetrafunctional alkoxysilane include tetramethoxysilane, tetraethoxysilane, tetra-n-propoxysilane, tetraisopropoxysilane, tetra-n-butoxysilane, and tetraisobutoxysilane.

Further, the polyalkoxysilane can be a compound in which the aforementioned at least two alkoxysilane compounds are bound to each other via a siloxane bond (Si—O bond). Specific examples thereof include a polyalkoxysilane compound (that is, alkoxysilicate compound) such as silicate 40, silicate 45, silicate 48, M silicate 51, or MTMS-A (manufactured by Tama Chemical Co., Ltd.)

(Fine Resin Particles)

The fine resin particles have a function of providing the hybrid layer with certain flexibility and also capturing a low molecular compound generated from the resin base or polysiloxane.

The fine resin particles which may be used are not particularly limited, but preferably (meth)acrylic acid ester-based fine resin particles or styrene-based fine resin particles.

Each of the (meth)acrylic acid ester-based fine resin particles and styrene-based fine resin particles can be produced by polymerization of a monomer as a raw material. The polymerization method is not particularly limited, and the production can be made with a well-known method, for example, emulsification polymerization, bulk polymerization, solution polymerization, suspension polymerization, or the like. When the production is performed by emulsification polymerization, the emulsification polymerization can be performed by adding under stirring a polymerization initiator to water containing a monomer as a raw material and a surfactant.

As for the monomer as a raw material, a known monomer can be used. Specifically, examples of the monomer as a raw material which may be used for production of the (meth) acrylic acid ester-based fine resin particles include methyl (meth)acrylate, ethyl(meth)acrylate, propyl(meth)acrylate, n-butylene(meth)acrylate, t-butyl(meth)acrylate, pentyl (meth)acrylate, isopentyl(meth)acrylate, n-hexyl(meth)acrylate, 2-methylpentyl(meth)acrylate, 3-methylpentylacrylate, 4-methylpentylacrylate, cyclohexyl(meth)acrylate, phenyl (meth)acrylate, 2,3-dimethylbutyl(meth)acrylate, 2,2-dimethylbutyl(meth)acrylate, 3,3-dimethylbutyl(meth)acrylate, 2-methylhexyl(meth)acrylate, 3-methylhexyl(meth)acrylate, 4-methylhexyl(meth)acrylate, 5-methylhexyl(meth)acrylate, 2,2-dimethylpentyl(meth)acrylate, 2,2-dimethylpentyl (meth)acrylate, 2,3-dimethylpentyl(meth)acrylate, 4,4-dimethylpentyl(meth)acrylate, 3,4-dimethylpentyl(meth)acrylate, n-octyl(meth)acrylate, 2-methylheptyl(meth)acrylate, 3-methylheptyl(meth)acrylate, 4-methylheptyl(meth)acrylate, 5-methylheptyl(meth)acrylate, 3-ethylhexyl(meth)acrylate, 4-ethylhexyl(meth)acrylate, and 5-methylhexyl(meth) acrylate. Further, examples of the monomer as a raw material which may be used for production of the styrene-based fine resin particles include styrene and α-styrene.

The monomer as a raw material can be also subjected to polymerization with a copolymerizable monomer to produce the (meth)acrylic acid ester-based fine resin particles and ester-based fine resin particles. The monomer copolymerizable with the monomer as a raw material monomer is not particularly limited, but examples thereof include (meth) acrylates having an oxyethylene unit such as polyethylene glycol monomethacrylate, polyethylene glycol monoacrylate, methoxypolyethylene glycol monomethacrylate, or methoxypolyethylene glycol monoacrylate; sulfonates such as sodium styrene sulfonate, potassium styrene sulfonate, sodium allylsulfonate, potassium allylsulfonate, sodium 2-acrylamide-2-methylpropanesulfonate, potassium 2-acrylamide-2-methylpropanesulfonate, sodium vinyl sulfonate, potassium vinyl sulfonate, sodium 2-sulfoethylmethacrylic acid, potassium 2-sulfoethylmethacrylic acid, or alkylallylsulfosuccinate; alkoxysilanes such as p-styryltrimethoxysilane, γ-methacryloxypropylmethyldimethoxysilane, γ-methacryloxypropyltrimethoxysilane, γ-methacryloxypropylmethyldiethoxysilane, γ-methacryloxypropyltriethoxysilane, or 3-acryloxypropyltrimethoxysilane; and a monomer containing carbonyl group such as acrolein, methacrolein, croton aldehyde, formyl styrene, formyl-α-methylstyrene, diacetone acrylamide, acrylamide pivalinaldehyde, methacryladmie pyvalinaldehyde, 3-acrylamide methyl-anisealdehyde, 3-methacrylamide methyl-anisealdehyde, β-acryloxy-α,α-dialkylpropanal, or β-methacryloxy-α,α-dialkylpropanal.

The aforementioned monomer as a raw material can be used either singly or in combination of two or more types. When the (meth)acrylic acid ester-based fine resin particles and ester-based fine resin particles are produced by using two or more kinds of monomers as a raw material and/or a monomer copolymerizable with it, the fine resin particles to be obtained can be any of a random copolymer, an alternating copolymer, a block copolymer, and a graft copolymer.

The solvent, surfactant, polymerization initiator, or the like which can be used for producing the fine resin particles can be suitably selected by a person skilled in the art from known ones based on common technical knowledge in the corresponding field of technology.

Average particle diameter of the fine resin particles is, although not particularly limited, preferably 1 to 200 nm, and more preferably 10 to 100 nm. When the average particle diameter of the fine resin particles is 1 nm or more, it can contribute to the adhesive property to the resin base, and therefore preferable. Meanwhile, when the average particle diameter of the fine resin particles is 200 nm or less, the surface smoothness can be maintained, and therefore preferable. Meanwhile, as described herein, the "average particle diameter" is obtained by performing an observation of a cross section of the hybrid layer with a transmission electron microscope (TEM), measuring the particle diameters of any ten fine resin particles among them, and employing the average value of the diameters.

The average particle diameter of fine resin particles can be controlled based on the reaction conditions for polymerization of the resin. For example, when the resin for obtaining the fine resin particles is produced by emulsification polymerization, by suitably controlling the reaction conditions such as amount of additives such as polymerization initiator, polymerization condition, the average particle diameter of the fine resin particles can be controlled.

The hybrid layer can be either a monolayer or a laminate of two or more layers. When two or more layers are laminated, each layer may include the same component or it may be a layer including different components. Further, the hybrid layers may be formed on both surfaces of the base.

By having the hybrid layer, the functional film has excellent bending resistance and stability under high temperature and high humidity conditions. Although it is not entirely clear, the reason of having such effect is believed to be as follows. Specifically, by containing polysiloxane, the hybrid layer has heat resistance. Further, by containing the fine resin particles together with polysiloxane, the hybrid layer can have suitable film strength, that is, the film strength between that of the resin base and functional inorganic film. Further, by containing both of polysiloxane as an inorganic matter and the fine resin particles as an organic matter, it can have a high adhesive property to an organic layer and also to an inorganic layer. Further, by containing the fine resin particles, the hybrid layer can have a function of capturing a low molecular compound.

Thus, when the hybrid layer is present between the resin base having flexibility and the functional inorganic layer having high hardness, because the hybrid layer has the film strength that is between that of the resin base and the functional inorganic layer and has high adhesive property to both of the resin base as an organic matter and the functional inorganic layer as an inorganic matter, an occurrence of peeling or cracks of the functional inorganic layer which may be caused by bending or the like can be suppressed. Further, because the hybrid layer has heat resistance in addition to the aforementioned performances, disruption of layer configuration accompanying the deformation of the resin base can be suppressed, for example, even under an environment with high temperature and high humidity. Further, because the hybrid layer can capture low molecular compounds which can cause a decrease in interlayer adhesiveness or a deterioration of performances of the functional inorganic layer, it can suppress the disruption of layer configuration accompanied with the use in an environment with high temperature and high humidity or the deterioration of performances.

Further, when the hybrid layer is arranged on a surface of the functional inorganic layer, wherein the surface of the functional inorganic layer is opposite to the resin base, spreading of defects such as a pin hole in the functional inorganic layer, which may occur by bending of the functional film or at high temperature and high humidity conditions, can be suppressed by high adhesion property to the functional inorganic layer and suitable film strength of the hybrid layer. Further, based on the ability of the hybrid layer to capture a low molecular compound, deterioration or the like of the performances of the functional inorganic layer can be suppressed.

The film strength of the hybrid layer can be controlled by content of the fine resin particles that are included in the hybrid layer. The content of the fine resin particles is, compared to the total volume of the hybrid layer, preferably 0.5 to 70% by volume, and more preferably 1 to 50% by volume. Meanwhile, the volume percentage of the fine resin particles is employed from the value obtained from observation of the cross section using a transmission electron microscope (TEM), similar to the average particle diameter described above.

The film thickness of the hybrid layer is preferably 10 nm to 100 µm, and more preferably 100 nm to 10 µm. When the hybrid layer is 10 nm or more, the functional film can be provided with the sufficient bending resistance and stability under high temperature and high humidity conditions, and therefore preferable. Meanwhile, when the hybrid layer is 100 µm or less, the flexibility can be maintained, and therefore preferable. Meanwhile, when the hybrid layer includes a laminate of two or more layers, the total film thickness is preferably within the aforementioned range. Further, when the hybrid layer is formed on both surfaces, thickness of each film is within the aforementioned range.

With regard to the relationship of the film thickness of the functional inorganic layer (that is, inorganic layer with a gas barrier property) described above, the film thickness of the functional inorganic layer compared to the film thickness of the hybrid layer (film thickness of the functional inorganic layer/film thickness of the hybrid layer) is preferably 0.001 to 10, more preferably 0.01 to 2, and even more preferably 0.1 to 1.0. When the film thickness ratio is within the aforementioned range, the fine resin particles in siloxane matrix contained in the hybrid layer and the hydroxyl group or free radicals which may be present in the functional inorganic layer can bind strongly to have suitably the effect of enhancing the interlayer adhesiveness between the hybrid layer and the functional inorganic layer, and therefore preferable. Accordingly, the aforementioned function of the hybrid layer is more preferably exhibited. For example, an occurrence of peeling at a layer interface between the hybrid layer and the functional inorganic layer or cracks caused by stress distributing effect in bending can be prevented. As a result, the functional film to be obtained has excellent bending resistance and stability under high temperature and high humidity conditions.

The hybrid layer may also contain an aminosilane compound, an epoxysilane compound, colloidal silica, or the like.

Aminosilane Compound

When the aminosilane compound is contained in the hybrid layer, the adhesiveness and scratch resistance can be improved.

The aminosilane compound is, although not particularly limited, an amino group-containing alkoxysilane compound generally not containing an epoxy group, and a compound represented by the following formula (2) is preferably used.

[Chem. 3]

$$(R^6)_n Si(OR^5)_{(4-n)} \tag{2}$$

In the above formula, each $R^6$ may be the same or different from each other and it is a C1 to C3 alkyl group substituted with at least one substituent group selected from a group consisting of a C1 to C4 alkyl group, an alkenyl group such as vinyl group, an aryl group such as a phenyl group, a methacryloxy group, and an amino group, in which at least one of $R^6$ is a C1 to C3 alkyl group substituted with an amino group, $R^5$ is a C1 to C4 alkyl group, and n is 1 or 2. Among them, with regard to the formula (2), it is preferable to use N-(2-aminoethyl)-3-aminopropylmethyldimethoxysilane, N-(2-aminoethyl)-3-aminopropyltrimethoxysilane, N-(2-aminoethyl)-3-aminopropyltriethoxysilane, 3-aminopropyltriethoxysilane, 3-aminopropyltrimethoxysilane, or N-methylaminopropyltrimethoxysilane.

Epoxysilane Compound

When the epoxysilane compound is contained in the hybrid layer, the adhesiveness, scratch resistance, and film formability can be improved.

The epoxysilane compound is, although not particularly limited, an epoxy group-containing alkoxysilane compound generally not containing an amino group, and a compound represented by the following formula (3) is preferably used.

[Chem. 4]

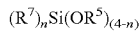
$$(R^7)_n Si(OR^5)_{(4-n)} \tag{3}$$

In the above formula, each $R^7$ may be the same or different from each other and it is a C1 to C3 alkyl group substituted with at least one substituent group selected from a group consisting of a C1 to C4 alkyl group, an alkenyl group such as vinyl group, an aryl group such as a phenyl group, a methacryloxy group, a glycidoxy group, an epoxycycloalkyl group such as a 3,4-epoxycyclohexyl group, in which at least one of $R^7$ is a C1 to C3 alkyl group substituted with a glycidoxy group or an epoxycylcoalkyl group, $R^5$ is a C1 to C4 alkyl group, and n is 1 or 2. Among them, with regard to the formula (3), it is preferable to use 3-glycidoxypropylmethyldiethoxysilane, 3-glycidoxypropyltrimethoxysilane, 2-(3,4-epoxycyclohexyl)ethyltrimethoxysilane, or 3-glycidoxypropyltriethoxysilane.

(Colloidal Silica)

When colloidal silica is contained in the hybrid layer, the scratch resistance can be improved.

Colloidal silica is a colloid suspension of silicon oxide having a Si—OH group on the surface that is generally caused by hydration in water, and it is also referred to as colloid silica or colloid silicate. The colloidal silica is not limited to colloidal silica of an aqueous dispersion system but it includes various forms like colloidal silica of a non-aqueous dispersion system, colloidal silica in fine powder state prepared by vapor phase method, and polymerized colloidal silica having a siloxane bond formed therein. Surface of the particle of colloidal silica is porous and, in the colloidal silica of an aqueous dispersion system, it is negatively charged in general.

As for the colloidal silica, those prepared by themselves or commercially available products can be used. As for the method for preparing colloidal silica, reference can be suitably made to a known method. For example, the colloidal silica of an aqueous dispersion system can be prepared by adding hydrochloric acid to an aqueous solution of sodium silicate. Examples of the commercially available product of colloidal silica include colloidal silica Quartron PL series of ultra-high purity (PL-1, PL-3, PL-7) (manufactured by Fuso Chemical Co., Ltd.), organosol with high purity (manufactured by Fuso Chemical Co., Ltd.), aqueous silica sol (Snowtex 20, Snowtex 30, Snowtex 40, Snowtex O, Snowtex O-40, Snowtex C, Snowtex N, Snowtex S, Snowtex 20L, Snowtex OL) (manufactured by Nissan Chemical Industries, Ltd.), and organosilica sol (methanol silica sol, MA-ST-MS, IPA-ST, IPA-ST-MS, IPA-ST-L, IPA-ST-ZL, IPA-ST-UP, EG-ST, NPC-ST-30, MEK-ST, MEK-ST-MS, MIBK-ST, XBA-ST, PMA-ST, DMAC-ST) (manufactured by Nissan Chemical Industries, Ltd.).

The average particle diameter of colloidal silica is preferably 200 nm or less.

Second Embodiment

Method for Producing Functional Film

According to the second embodiment of the present invention, a method for producing a functional film including a resin base, a functional inorganic layer that is arranged on the resin base, and a hybrid layer that is arranged on at least one surface of the functional inorganic layer is provided. The method for producing a functional film includes Step (1) of forming the hybrid layer by coating the first coating liquid containing polysiloxane and fine resin particles.

[Step (1)]

Step (1) is a step of forming the hybrid layer by coating the first coating liquid containing polysiloxane and fine resin particles. The first coating liquid can be coated on top of the resin base and/or on top of the functional inorganic layer.

(First Coating Liquid)

The first coating liquid contains polysiloxane and fine resin particles. The polysiloxane and fine resin particles can be the same as those of the first embodiment.

The first coating liquid may also contain an aminosilane compound, an epoxysilane compound, colloidal silica, a solvent, and a curing catalyst.

The aminosilane compound, epoxysilane compound, and colloidal silica to be used can be the same as those of the first embodiment.

Because the polysiloxane contained in the hybrid layer is formed from an alkoxysilane compound or a polyalkoxysilane compound as described above, the polysiloxane can be prepared during the process of Step (1) by containing an alkoxysilane compound and/or a polyalkoxysilane compound with/or instead of polysiloxane in the first coating liquid. At that time, the alkoxysilane compound and polyalkoxysilane compound which can be used may be the same as those of the first embodiment.

Solvent

Examples of the solvent which can be contained in the first coating liquid include, although not particularly limited, water, an alcohol-based solvent, an aromatic hydrocarbon-based solvent, an ether-based solvent, a ketone-based solvent, and an ester-based solvent. Examples of the alcohol-based solvent include methanol, ethanol, n-propyl alcohol, isopropyl alcohol, n-butyl alcohol, sec-butyl alcohol, tert-butyl alcohol, n-hexyl alcohol, n-octyl alcohol, ethylene glycol, diethylene glycol, triethylene glycol, ethylene glycol monobutyl ether, ethylene glycol monoethyl ether acetate, diethylene glycol monoethyl ether, propylene glycol monomethyl ether, propylenemonomethyl ether acetate, diacetone alcohol, methyl cellosolve, ethyl cellosolve, propyl cellosolve, and butyl cellosolve. Examples of the aromatic hydrocarbon solvent include toluene and xylene. Examples of the ether-based solvent include tetrahydrofuran, 1,4-dioxane, and 1,2-dimethoxyethane. Examples of the ketone-based solvent include cyclohexanone, acetone, methyl ethyl ketone, and methyl isobutyl ketone. Examples of the ester-based solvent include methyl acetate, ethyl acetate, and ethoxyethyl acetate. In addition to them, a solvent such as dichloroethane and acetic acid can be used. The solvent can be used either singly or in combination of two or more types.

Curing Catalyst

The curing catalyst is a catalyst for hydrolyzing and condensing (curing) the silane compound contained in the first coating liquid.

The curing catalyst which may be used is not particularly limited, and examples thereof include inorganic acid, organic acid, organometallic salt, and a Lewis acid. Examples of the inorganic acid include hydrochloric acid, sulfuric acid, nitric acid, phosphoric acid, nitrous acid, perchloric acid, and sulfamic acid. Examples of the organic acid include formic acid, acetic acid, propionic acid, butyric acid, oxalic acid, succinic acid, maleic acid, lactic acid, p-toluene sulfonic acid, and citric acid. Examples of the organometallic salt include lithium hydroxide, sodium hydroxide, potassium hydroxide, n-hexylamine, dimethylamine, tributylamine, die zabicycloundecene, ethanolamine acetate, dimethylaniline formate, tetraethylammonium benzoate, sodium acetate, potassium acetate, sodium propionate, potassium propionate, sodium formate, potassium formate, benzoyltrimethyl ammonium acetate, tetramethylammonium acetate, and tin octylate. Examples of the Lewis acid include tetraisopropyl titanate, tetrabutyl titanate, aluminum triisobutoxide, aluminum triisopropoxide, aluminum acetoacetate, tin chloride ($SnCl_4$), titanium chloride ($TiCl_4$), and zinc chloride ($ZnCl_2$). Among them, from the viewpoint of dispersing the coating liquid at high level and enhancing the transparency of the hybrid layer to be obtained even when the content of the organic microparticles which may be contained with the silence compound in the first coating liquid increases, it is preferable to use an organic acid. It is more preferable to use organic carboxylic acid. It is even more preferable to use acetic acid. The curing catalyst may be used either singly or as a mixture of two or more types.

(Formation of Hybrid Layer)

The hybrid layer is formed by coating the first coating liquid on top of the resin base or on top of the functional inorganic layer. As for the method for coating the first coating liquid, a suitable known method can be employed. Specific examples thereof include a spin coating method, a roll coating method, a flow coating method, an inkjet method, a spray coating method, a printing method, a dip coating method, a casting film forming method, a bar coating method, and a gravure printing method.

The coating amount of the first coating liquid is not particularly limited, and it can be suitably controlled to have the desired thickness of the hybrid layer that is described above.

After coating on top of the resin base or top of the functional inorganic layer, the coating liquid is preferably dried and cured. Conditions for drying•curing are not particularly limited, but drying•curing is generally performed at 80 to 190° C., and preferably 100 to 140° C. for 10 minutes to 24 hours, and preferably 30 minutes to 3 hours.

The coating film or the hybrid layer obtained in Step (1) may be subjected to the vacuum ultraviolet irradiation that is performed in Step (2) described below.

The method for producing a functional film according to the second embodiment may have Step (2) in which a coating film is formed by coating the second coating liquid containing an inorganic precursor and forming the functional inorganic layer by performing a modification treatment of the coating film.

The functional inorganic layer according to this embodiment can be formed by a physical deposition method (PVD method) for forming a film on a substrate by evaporating metal or oxide, a chemical vapor deposition method (CVD method) for depositing a film based on a chemical reaction on a surface of a substrate or in vapor phase after supplying a raw material gas (for example, an organosilicon compound represented by tetraethoxyosilane (TEOS)), or a sputtering method for depositing metal silicon (Si) on a substrate in the presence of oxygen after evaporating the metal silicon. However, the functional inorganic layer formed by the aforementioned step (2) is preferable.

[Step (2)]

Step (2) is a step of forming a coating film by coating the second coating liquid containing an inorganic precursor and forming a functional inorganic layer by performing a modification treatment of the coating film. The second coating liquid can be coated on top of the resin base and/or top of the hybrid layer. In particular, when the second coating liquid is coated on top of the hybrid layer, the second coating liquid is impregnated within the hybrid layer due to the function of the hybrid layer for capturing a low molecular compound so that the adhesiveness between the hybrid layer and the functional inorganic layer is further improved, and therefore preferable.

(Second Coating Liquid)

The second coating liquid contains an inorganic precursor.

Inorganic Precursor

The inorganic precursor is not particularly limited, but it is preferable to use polysilazane.

The polysilazane to be used can be the same as that of the first embodiment.

The content of the polysilazane in the second coating liquid may vary depending on the desired film thickness or pot life of the coating liquid. However, it is preferably 0.2% by mass to 35% by mass compared to the total amount of the second coating liquid.

The second coating liquid may additionally contain an amine catalyst, a metal, and a solvent.

Amine Catalyst and Metal

The amine catalyst and metal can promote the conversion of polysilazane into a silicon oxide compound during the modification treatment described below. Examples of the amine catalyst include N,N,N',N'-tetramethyl-1,6-diaminohexane. Examples of the metal include palladium. It is preferable that the amine catalyst and metal are contained at 0.1 to 10% by mass compared to polysilazane in the first coating liquid. In particular, from the viewpoint of enhancing the coatability and shortening the reaction time, the amine catalyst is preferably contained at 0.5 to 5% by mass compared to polysilazane in the first coating liquid.

Solvent

The solvent which may be contained in the second coating liquid is not particularly limited as long as it does not react with polysilazane, and a known solvent can be used. Specific examples thereof include a hydrocarbon-based solvent such as an aliphatic hydrocarbon, an alicyclic hydrocarbon, an aromatic hydrocarbon, or a halogenated hydrocarbon; and an ether-based solvent such as aliphatic ether or alicyclic ether. More specific examples thereof include pentane, hexane, cyclohexane, toluene, xylene, solvesso, turpentine, methylene chloride, and trichloroethane. Further, examples of the ether-based solvent include dibutyl ether, dioxane, and tetrahydrofuran. The solvent can be used either singly or as a mixture of two or more types.

(Formation of Functional Inorganic Layer)

In Step (2), the second coating liquid is coated to form a coating film and the functional inorganic layer is formed by performing a modification treatment of the coating film. The second coating liquid can be coated on top of the resin base or on top of the hybrid layer.

Coating with Second Coating Liquid

As for the method for coating the second coating liquid, a suitable known method can be employed. Specific examples thereof include a spin coating method, a roll coating method, a flow coating method, an inkjet method, a spray coating method, a printing method, a dip coating method, a casting film forming method, a bar coating method, and a gravure printing method.

The coating amount of the second coating liquid is not particularly limited, and it can be suitably controlled to have the desired thickness of the functional inorganic layer that is described above.

After the coating, the second coating liquid is preferably dried. From the viewpoint of obtaining an even coating film, it is more preferable to perform annealing.

The annealing temperature is, although not particularly limited, preferably 60 to 200° C. and more preferably 70 to 160° C. The annealing temperature can be constant, gradually changed, or continuously changed (that is, increasing and/or lowering the temperature).

The annealing time is, although not particularly limited, preferably 5 seconds to 24 hours, and more preferably 10 seconds to 2 hours.

Modification Treatment

Modification of a coating film means a conversion of an inorganic precursor which constitutes a coating film. For example, when polysilazane contained in the coating film is converted, it can be converted into a silicon oxide compound and/or a silicon oxynitride compound.

The modification treatment can be performed by ultraviolet irradiation under an oxidative gas atmosphere and in an environment of low humidity. By irradiating ultraviolet rays, the ultraviolet rays or active oxygen and/or ozone that are generated from oxygen in an oxidative gas atmosphere by ultraviolet rays cause an oxidation reaction of the inorganic precursor so as to form the functional inorganic layer with desired composition. Because the active oxygen or ozone has very high reactivity, the inorganic precursor, for example, polysilazane can be directly oxidized without being mediated by silanol. As a result, the functional inorganic layer with higher density and less defects containing silicon oxide and/or silicon oxynitride can be formed. Meanwhile, when ozone generated from oxygen is not sufficient, it is possible that ozone is separately generated by a well-known method such as an electric discharge method and introduced into a reaction vessel for performing the modification treatment.

The wavelength of the ultraviolet rays for irradiation is, although not particularly limited, preferably 10 to 450 nm, more preferably 100 to 300 nm, even more preferably 100 to 200 nm, and particularly preferably 100 to 180 nm. Meanwhile, as described herein, the ultraviolet rays with high energy of 200 nm or less are also specifically referred to as "vacuum ultraviolet rays (VUV light)" From the viewpoint of having a progress of the conversion reaction at low temperature and also in short time, the ultraviolet rays for irradiation are preferably vacuum ultraviolet rays. Because the vacuum ultraviolet irradiation has high energy, it enables easy progress of the conversion reaction and easy conversion of oxygen into active oxygen or ozone, and therefore the conversion reaction can be efficiently performed. As a result, the functional inorganic film to be obtained has high density so that the functional inorganic layer can have high performances. Meanwhile, the vacuum ultraviolet irradiation can be performed at any time point after forming the coating film.

The light source of ultraviolet rays is not particularly limited, but a low pressure mercury lamp, a deuterium lamp, a xenon excimer lamp, a metal halide lamp, an excimer laser, or the like can be used. Among them, a rare gas excimer lamp such as a xenon excimer lamp is preferably used.

The lamp output is preferably 400 W to 30 kW. The illuminance is preferably 1 mW/cm² to 100 kW/cm², and more preferably 1 mW/cm² to 10 W/cm². The irradiation energy is preferably 10 to 10000 mJ/cm², and more preferably 100 to 8000 mJ/cm².

The rare gas excimer lamp such as a xenon excimer lamp can irradiate vacuum ultraviolet rays. Because the rare gas atom such as Xe, Kr, Ar, and Ne has valence atoms in closed shell state, it is chemically very inert, and thus referred to as inert gas. However, an atom of rare gas, which has acquired energy by the discharge or the like (excited atom), can form a molecule by the bonding with other atoms. For example, in the case where the rare gas is xenon, it is as follows.

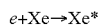

$e + Xe \rightarrow Xe^*$

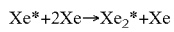

$Xe^* + 2Xe \rightarrow Xe_2^* + Xe$

$Xe_2^* \rightarrow Xe + Xe + h\nu$     (172 nm)

In that case, when the $Xe_2^*$ that is an excited excimer molecule is shifted to the ground state, excimer light (vacuum ultraviolet rays) with a wavelength of 172 nm is emitted. The aforementioned excimer lamp uses the excimer light. As a method for obtaining excimer light, a method of using dielectric barrier discharge and a method of using electrodeless electric field discharge can be mentioned, for example.

The dielectric barrier discharge is discharge called very fine micro discharge that is similar to lightning occurring in a gas space, wherein the dielectric barrier discharge occurs when arranging the gas space between two electrodes via a dielectric body (transparent quartz in the case of an excimer lamp) and applying high voltage with a high frequency of several tens of kHz to the electrodes. Because charges are concentrated on a surface of the dielectric body once the streamer of the micro discharge reaches the tube wall (dielectric body), the micro discharge is extinguished. According to the dielectric barrier discharge, the micro discharge is propagated over the entire tube wall and undergoes a repeating generation•extinguishment, and flickering lights that can be observed even by a naked eye is produced. Further, because the streamer at very high temperature reaches locally but directly the tube wall, there is a possibility of having rapid deterioration of the tube wall.

Further, the electrodeless field discharge is discharge based on capacitive coupling, and is also called RF discharge as another name. Specifically, a lamp, electrodes, or the like are also arranged like those in the dielectric barrier discharge, and the high frequency to be applied between the two electrodes is spatially and also timely uniform discharge that is generated when high frequency voltage of several MHz is applied. According to the method of using the electrodeless field discharge, a lamp with no flickering but with long lifetime can be obtained.

In case of dielectric barrier discharge, micro discharge occurs only between electrodes, and thus for performing discharge in an entire discharge space, the entire outer surface of an external electrode needs to be covered, and the external electrode needs to be capable of transmitting light to extract the light to an outside. For such reasons, an electrode made of a thin metal wire in mesh type is used as the external electrode so as not to block the light. However, the external electrode may be easily damaged by ozone or the like occurred by vacuum ultraviolet ray irradiation. To prevent the damages of the electrode, there is a need that surrounding of a lamp, that is, inside of the irradiation apparatus, is prepared to have an atmosphere of inert gas such as nitrogen and irradiated light is extracted by installing a synthetic quartz window. Among them, since a cylindrical lamp has an outer diameter of about 25 mm, a difference in distance to an irradiation surface cannot be ignored from the position right below the lamp axis and the lateral surface of the lamp, and it may generate a great difference in illuminance depending on the distance. Thus, even when lamps are arranged such that they are close to each other, it cannot be said that uniform illuminance distribution is obtained. However, with an irradiation apparatus installed with a synthetic quartz window, uniform distance in an oxygen atmosphere is achieved, and thus uniform illuminance distribution can be obtained. However, the synthetic quartz window is not only an expensive consumables but also causes loss of light.

Meanwhile, in case of the electrodeless field discharge, it is unnecessary to have a mesh type external electrode. Only by forming an external electrode on part of the outer surface of the lamp, glow discharge propagates to an entire discharge space. As an external electrode, an electrode also functioning as a light reflector made of an aluminum block can be generally used on a rear surface of the lamp. However, since the outer diameter of the lamp is large like that in the dielectric barrier discharge, synthetic quartz is required so as to have uniform illuminance distribution.

The biggest characteristic of the micro tube excimer lamp is that the structure is simple. Gas for performing excimer radiation is sealed inside only by closing both ends of quartz tube.

The outer diameter of the micro tube lamp is preferably 6 to 12 mm, and when it is too thick, high voltage is required for initiation.

Discharge mode may be any one of dielectric barrier discharge and electrodeless field discharge. As for the shape of the electrode, a surface in contact with the lamp may be a flat surface. However, when it has a shape along curvature of the lamp, not only the lamp can be fixed strongly but also more stable discharge is obtained as the electrode is in close contact with the lamp. Further, when the curved space is made of aluminum to have a mirror surface, it can also function as a light reflector.

As for the device for irradiation of excimer light (vacuum ultraviolet rays), a commercially available lamp (for example, those manufactured by Ushio Electric Inc.) can be used.

Because the excimer lamp has a characteristic that the excimer light is concentrated on one wavelength so as to radiate almost no light other than required light, it has high efficiency. Further, as no extra light is radiated, temperature of the subject can be maintained at low level. Further, as it requires no time for initiation•re-initiation, it is possible to have instant lighting and extinguishing. In particular, the Xe excimer lamp radiates ultraviolet rays with single wavelength, that is, short wavelength of 172 nm, and thus the radiation efficiency is excellent. Because the Xe excimer lamp has short wavelength of 172 nm and high energy, it is known to have a high ability of degrading an organic compound. Further, as the Xe excimer lamp has high oxygen absorption coefficient, it can generate efficiently the active oxygen or ozone from even a trace amount of oxygen. For example, compared to a low pressure mercury vapor lamp irradiating vacuum ultraviolet rays at wavelength of 185 nm, the Xe excimer lamp has a high ability of braking the bonds in an organic compound and can generate efficiently the active oxygen or ozone, and thus it can be useful for the modification treatment of polysilazane at low temperature and also in short time. Further, because the Xe excimer lamp has high efficiency of light generation, instant lighting and extinguishing light at low power is possible and can emit light with single wavelength, and thus it is preferable from the economic viewpoint of shortening the process time accompanying high throughput and reducing an area for facilities and also from the viewpoint of applying to a functional film in which a substrate easily susceptible to damages caused by heat is used.

As described above, the excimer lamp has high efficiency for light generation, and thus lighting can be obtained at low power and also the increase in surface temperature of an irradiation subject can be suppressed. Further, as the number of photons that enter the inside is also increased, it is possible that the increase in modified film thickness and/or a film with high density can be obtained. However, with excessively long irradiation time, deterioration of flatness may be caused or other material of the functional film may be adversely affected. In general, the conversion reaction is considered by an integrated light amount as an indicator, wherein the integrated light amount is represented as a product of irradiation strength and irradiation time. However, even with the same composition like silicon oxide, when materials having various structural forms are used, sometimes the absolute value of the irradiation strength may become important.

Thus, when the conversion reaction is performed by vacuum ultraviolet irradiation, it is preferable that the maximum irradiation strength of 100 to 200 mW/cm$^2$ is used for at least one irradiation. When the maximum irradiation strength is 100 mW/cm$^2$ or higher, the modification efficiency is improved and the conversion reaction can progress in a short time, and therefore preferable. On the other hand, when the maximum irradiation strength is 200 mW/cm$^2$ or lower, the deterioration of the functional film or the deterioration of the lamp itself can be suppressed, and therefore preferable.

Irradiation time for the vacuum ultraviolet irradiation is, although not particularly limited, preferably 0.1 second to 3 minutes, and preferably 0.5 second to 1 minute for high-illuminance process.

Oxygen concentration for the vacuum ultraviolet irradiation is preferably 500 to 10000 ppm (1%), and more preferably 1000 to 5000 ppm. When the oxygen concentration is 500 ppm or higher, the modification efficiency is enhanced, and therefore preferable. On the other hand, when the oxygen concentration is 10000 ppm or less, the substitution time between air and oxygen can be shortened, and therefore preferable.

The coating film as a subject for ultraviolet irradiation includes oxygen and a trace amount of water that are incorporated therein during the coating, and also adsorbed oxygen or adsorbed water may be present in the substrate or neighboring layer, or the like. By using the oxygen or the like, the oxygen source required for generation of active oxygen or ozone for performing the modification treatment may be sufficient even when no oxygen is newly introduced to the irradiation chamber. Further, as vacuum ultraviolet rays of 172 nm like an Xe excimer lamp are absorbed by oxygen, there can be a case in which the amount of vacuum ultraviolet rays reaching the coating film is decreased. Thus, for irradiation of vacuum ultraviolet rays, it is preferable to have a low oxygen concentration and a condition for allowing efficient delivery of vacuum ultraviolet rays to the coating film.

Gas other than oxygen in an atmosphere of irradiating vacuum ultraviolet rays is preferably a dry inert gas. From the viewpoint of cost, it is more preferable to use dry nitrogen gas, in particular. Meanwhile, the oxygen concentration can be adjusted by measuring the gas amount of oxygen gas or inert gas that is introduced to the irradiation chamber and changing the flow rate.

The generated vacuum ultraviolet rays can be, after reflecting the vacuum ultraviolet rays from the generation source by a reflector, irradiated onto the polysilazane layer before modification from the viewpoint of enhancing the irradiation efficiency and achieving even irradiation. Further, the vacuum ultraviolet irradiation can be applied to a batch processing and to a continuous processing, and thus the processing can appropriately be selected depending on the shape of the substrate to be coated. For example, in the case where the substrate is in the shape of a long-length film, while conveying the substrate, the modification is preferably performed by irradiating continuously the vacuum ultraviolet rays.

The modification treatment is preferably performed in a combination of a heating treatment. By combining a heating treatment, the conversion reaction can be promoted. The method for heating is not particularly limited, and examples thereof include a method of heating the coating film by thermal conduction as a result of contacting a substrate with a heating element such as a heat block, a method of heating an atmosphere by using an external heater such as resistance wires, and a method of using light of infrared region such as an IR heater. Those methods can be suitably selected in view of the smoothness of the coating film, or the like.

Temperature for the heating treatment is, although not particularly limited, preferably 50 to 200° C. and more preferably 80 to 150° C. Further, the heating time is preferably 1 second to 10 hours, and more preferably 10 seconds to 1 hour.

The second coating liquid containing polysilazane and the coating film may experience a hydrolysis reaction due to moisture, which is absorbed according to their exposure to a condition with high humidity, as it is difficult to remove the absorbed moisture. In particular, the coating film is easily influenced by water vapor in accordance with an increase in surface area. Accordingly, it is preferable that the period from the preparation stage of the second coating liquid to the end of the modification treatment, in particular, the period from the formation of the coating film to the end of the modification treatment, is maintained or handled in an atmosphere with dew point of 10° C. (temperature: 25° C., relative humidity (RH): 39%) or lower, preferably dew point of 8° C. (temperature: 25° C., relative humidity (RH): 10%) or lower, and more preferably dew point of −31° C. (temperature: 25° C., relative humidity (RH): 1%) or lower. Accordingly, the generation of Si—OH in the functional inorganic layer can be suppressed. Meanwhile, as described herein, the "dew point temperature" indicates the temperature at which condensation first starts to form when air containing water vapor is cooled, and it is an indicator representing the moisture amount in an atmosphere. The dew point temperature can be measured by performing direct measurement using a dew point thermometer. It is also possible that water vapor pressure is obtained from the temperature and relative humidity and the temperature at which the obtained water vapor temperature is saturated water vapor temperature is calculated. In that case, the temperature measured at relative humidity of 100% becomes the dew point temperature.

The film thickness, density or the like of the functional inorganic layer obtained by the aforementioned modification treatment can be controlled by suitably selecting conditions for coating, intensity, irradiation time, wavelength (energy density of light), and irradiation method of ultraviolet rays, heating temperature, or the like. For example, by suitably selecting a method of irradiating ultraviolet rays from continuous irradiation, irradiation with several divided irradiations, or so-called pulse irradiation in which several irradiations are performed for a short time, the film thickness or density of the functional inorganic layer can be controlled.

With regard to the level of the modification treatment, according to XPS surface analysis of the formed functional inorganic layer, determination can be made by obtaining compositional ratio of each atom including a silicon (Si) atom, a nitrogen (N) atom, and an oxygen (O) atom.

The functional inorganic layer may be either a monolayer or a laminate of two or more layers. From the viewpoint of efficient repair of the defects that are caused by impurities of defects at nano level such as a pin hole, it is preferable that two or more functional inorganic layers are laminated. When two or more functional inorganic layers are formed, each layer may be the same or different from each other. For example, in case of the functional inorganic layer obtained by laminating two layers, the second layer (top layer) is preferably formed by Step (2). The reason is that, by performing the modification treatment of this leveled coating film, a functional inorganic layer having a smooth surface can have a repair after filling a small hole and the permeation of water vapor that is caused by initially present defects can be prevented.

Third Embodiment

Electronic Device

According to the third embodiment of the present invention, an electronic device including a main body of an electronic device and the aforementioned functional film is provided. Because the aforementioned functional film has excellent bending resistance and stability under high temperature and high humidity conditions, it can be suitably applied to an electronic device.

Although not particularly limited, examples of the electronic device include a liquid crystal display (LCD) element, a photovoltaic (PV) cell, and an organic electroluminescence (EL).

As for the use of the functional film, although not particularly limited, it can be used as a constitutional element of a substrate for constituting an electronic device or a sealing agent for sealing an electronic device. Among them, it is preferably used as a sealing agent.

Hereinbelow, this embodiment is described by having an organic electroluminescence (EL) panel as an example, but the present invention is not limited to it.

<Organic Electroluminescence (EL) Panel>

Figure 4:
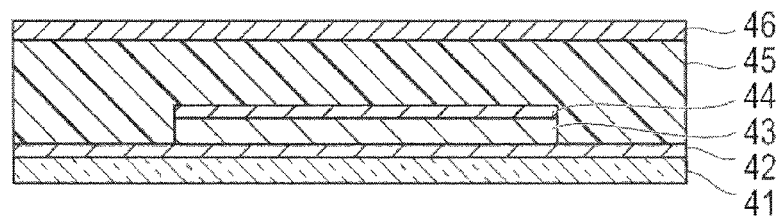
FIG. 4 is a schematic diagram of a cross-section illustrating an organic EL panel according to an embodiment of the present invention.

FIG. 4 is a schematic diagram of a cross-section of the organic EL panel according to one embodiment.

The organic EL panel 40 is equipped with the functional film 41, the positive electrode 42 as a transparent electrode formed on the functional film 41, the organic EL layer 43 formed on the positive electrode 42, the negative electrode 44 formed on the organic EL layer 43, and the sealing member 46 including an aluminum foil which is formed as intermediated by the adhesive layer 45 to cover the organic EL layer 43 and the negative electrode 44. In this case, the organic EL layer 43 and the negative electrode 44 are also collectively referred to as an organic EL element. Meanwhile, in other examples, the positive electrode 42 can be a part of an organic EL element.

The functional film 41 according to this embodiment is used for sealing, and accordingly, deterioration of the organic EL element caused by water vapor can be suppressed. As a result, the organic EL panel 40 can have a long lifetime.

Meanwhile, other than a metal film such as an aluminum foil, the functional film according to the present invention can be used for the sealing member 46. When a functional film is used for the sealing member 46, adhesion using adhesive can be carried out such that the resin base constituting the functional film is arranged on the outside.

Hereinbelow, each element constituting an organic EL panel is described.

(Organic EL Element)

Although not particularly limited, the organic EL element can have the following layer configuration.

(1) positive electrode/light emitting layer/negative electrode (2) positive electrode/hole transport layer/light emitting layer/negative electrode (3) positive electrode/light emitting layer/electron transport layer/negative electrode (4) positive electrode/hole transport layer/light emitting layer/electron transport layer/negative electrode (5) positive electrode/positive electrode buffer layer (hole injection layer)/hole transport layer/light emitting layer/electron transport layer/negative electrode buffer layer (electron injection layer)/negative electrode.

(Positive Electrode)

For the positive electrode, although not particularly limited, a metal, alloy, an electric conductive compound, and a mixture thereof having a big work function (4 eV or higher) is preferably used. Specific examples include a metal such as gold (Au) and a conductive transparent material such as copper iodide (CuI), indium tin oxide (ITO), tin oxide ($SnO_2$), or zinc oxide (ZnO). Further, a material enabling production of an amorphous and transparent conductive film such as IDIXO ($In_2O_3$—ZnO) can be also used.

The positive electrode can be formed as a thin film by a method of depositing or sputtering electrode materials. At that time, pattern formation can be also performed by a photolithography method. When high pattern precision (about 100 μm or higher) is not required, a pattern can be formed by deposition using a mask or sputtering.

When illuminating light is extracted from a positive electrode, the transmittance is preferably 10% or higher. Further, the sheet resistance of the positive electrode is several hundred Ω/□ (square) or less. Further, although it may vary depending on materials, the film thickness of the positive electrode is generally 10 to 1000 nm, and preferably 10 to 200 nm.

(Negative Electrode)

For the negative electrode, although not particularly limited, a metal (hereinbelow, also referred to as an "electron injecting metal"), alloy, an electric conductive compound, and a mixture thereof having a small work function (4 eV or lower) is preferably used. Specific examples thereof include sodium, a sodium potassium alloy, magnesium, lithium, a magnesium/copper mixture, a magnesium/silver mixture, a magnesium/aluminum mixture, a magnesium/indium mixture, an aluminum/aluminum oxide ($Al_2O_3$) mixture, indium, a lithium/aluminum mixture, and a rare earth metal. Among these, from the viewpoint of electron injection property and durability against oxidation, it is preferable to use a mixture of a metal with an electron injection property and a metal having a significantly larger work function than that of the foregoing metal with an electron injection property such as a magnesium/silver mixture, a magnesium/aluminum mixture, a magnesium/indium mixture, an aluminum/aluminum oxide ($Al_2O_3$) mixture, and a lithium/aluminum mixture.

The negative electrode can be formed as a thin film by a method of depositing or sputtering electrode materials.

The sheet resistance of the negative electrode is several hundred Ω/□ (square) or less. Further, the film thickness of the negative electrode is generally 1 nm to 5 μm, and preferably 50 to 200 nm.

Meanwhile, to obtain excellent light emitting brightness by transmitting emitted light, it is preferable that either of the positive electrode and the negative electrode is transparent or semi-transparent. Further, after forming a negative electrode with film thickness of 1 to 20 nm using a metal that can be used for the negative electrode, by forming a conductive transparent material usable as the positive electrode on the produced negative electrode, a transparent or semi-transparent negative electrode can be produced. With an application thereof, an element in which both the positive electrode and negative electrode have a transmitting property can be produced.

(Injection Layer: Electron Injection Layer and Hole Injection Layer)

The injection layer includes an electron injection layer (negative electrode buffer layer) and a hole injection layer (positive electrode buffer layer), and an electron injection layer and a hole injection layer are formed, as necessary, and it is disposed between the positive electrode and the light emitting layer or the hole transport layer, and/or between the negative electrode and the light emitting layer or the electron transport layer.

The injection layer is a layer formed between an electrode and an organic layer to lower the decrease in operation voltage or to improve the light emitting brightness, and detailed descriptions are given in "Electrode Materials" (pages 123 to 166) of Section 2 of Chapter 2 of "Organic EL element and Frontier for its Industrialization (published by N•T•S on Nov. 30, 1998).

The hole injection layer (positive electrode buffer layer) is described in detail in Japanese Patent Application Laid-Open Nos. H9-45479, H9-260062, H8-288069, or the like. Specific examples thereof include a phthalocyanine buffer layer represented by copper phthalocyanine, an oxide buffer layer represented by vanadium oxide, an amorphous carbon buffer layer, and a polymer buffer layer in which a conductive polymer such as polyaniline (emeraldine) or polythiophene is used.

The electron injection layer (negative electrode buffer layer) is described in detail in Japanese Patent Application Laid-Open Nos. H6-325871, H9-17574, H10-74586, or the like. Specific examples thereof include a metal buffer layer represented by strontium or aluminum, an alkali metal compound buffer layer represented by lithium fluoride, an alkali earth metal compound buffer layer represented by magnesium fluoride, and an oxide buffer layer represented by aluminum oxide.

The injection layer (buffer layer) is preferably an extremely thin film. Although it may vary depending on the materials, the film thickness is preferably 0.1 nm to 5 μm.

(Light Emitting Layer)

The light emitting layer is a layer exhibiting light emission based on recombination of electrons and holes that are injected from an electrode (negative electrode, positive electrode) or an electron transport layer, a hole transport layer, and the light emitting part may be present inside the light emitting layer or at an interface between the light emitting layer and the neighboring layer.

From the viewpoint of further enhancing the light emitting efficiency, the light emitting layer preferably contains a dopant compound (light emitting dopant) and a host compound (light emitting host).

Light Emitting Dopant

Broadly classified, the light emitting dopant includes two kinds, that is, a fluorescent dopant which emits fluorescence and a phosphorescent dopant which emits phosphorescence.

Although not particularly limited, examples of the fluorescent dopant include a coumarine-based pigment, a pyrane-based pigment, a cyanine-based pigment, a chroconium-based pigment, a squarylium-based pigment, an oxobenzanthracene-based pigment, a fluorescein-based pigment, a rhodamine-based pigment, a pyrilium-based pigment, a perylene-based pigment, a stilbene-based pigment, a polythiophene-based pigment, and a rare earth complex-based fluorescent.

Although not particularly limited, examples of the phosphorescent dopant include a complex-based compound containing a metal of group 8, group 9, or group 10 of the Periodic Table of the Elements. Among them, preferred are an iridium compound and an osmium compound. More preferred is an iridium compound.

The light emitting dopant may be used either singly or as a mixture of two or more types.

(Light Emitting Host)

The light emitting host (also simply referred to as a "host") means the compound having the highest mixing ratio (mass) in the light emitting layer which contains two or more kinds of a compound. Other compounds are referred as a dopant compound (also simply referred to as a "dopant"). For example, when the light emitting layer consists of two kinds including the compound A and the compound B and the mixing ratio is as follows; A:B=10:90, the compound A is a dopant compound and the compound B is a host compound. Further, when the light emitting layer consists of three types including the compound A, the compound B, and the compound C and the mixing ratio is as follows; A:B:C=5:10:85, the compound A and the compound B are a dopant compound and the compound C is a host compound.

Although not particularly limited, as a light emitting host, those having a basic skeleton such as carbazole derivatives, triarylamine derivatives, aromatic borane derivatives, a nitrogen-containing heterocyclic compound, thiophene derivatives, furan derivatives, and an oligoarylene compound, or carboline derivatives or diazacarbazole derivatives (herein, the diazacarbazole derivatives indicate carboline derivatives in which at least one carbon atom of the hydrocarbon ring constituting the carboline ring is substituted with a nitrogen atom) or the like can be used. Among them, it is preferable to use carboline derivatives, diazacarbazole derivatives, or the like.

The light emitting layer can be formed by a known method for obtaining a thin film such as a vacuum deposition method, a spin coating method, a casting method, an LB method, or an inkjet method. The film thickness of the light emitting layer is, although not particularly limited, generally 5 nm to 5 µm, and preferably 5 to 200 nm.

The light emitting layer can have a monolayer structure including one or two or more kinds of a dopant compound or a host compound, or a laminate structure including plural layers with the same composition or heterogeneous composition.

(Hole Transport Layer)

The hole transport layer includes a hole transport material which has a function of transporting holes, and in broad sense, the hole transport layer includes a hole injection layer and an electron blocking layer. The hole transport layer can be formed as a monolayer or plural layers.

As for the material for hole transport, it is not particularly limited as long as it has any one of a hole injection or transport property and an electron blocking property, and either an organic matter or an inorganic matter can be used. Examples of the material for hole transport include a conductive polymeric oligomer such as triazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, oxazole derivatives, styrylanthracene derivatives, fluorenone derivatives, hydrazone derivatives, stilbene derivatives, silazane derivatives, an aniline-based copolymer, or a thiophene oligomer, and a porphyrin compound, an aromatic tertiary amine compound, and a styrylamine compound. Among them, it is preferable to use an aromatic tertiary amine compound. Further, a polymeric material having the aforementioned material introduced to a polymer chain or having the aforementioned material as a main chain can be also used. Still further, an inorganic compound such as p type-Si or p type-SiC can be also used.

The hole transport layer can be formed by a known method for obtaining a thin film such as a vacuum deposition method, a spin coating method, a casting method, a printing method including an inkjet method, and an LB method.

The film thickness of the hole transport layer is, although not particularly limited, generally 5 nm to 5 and preferably 5 to 200 nm.

The hole transport layer can have a monolayer structure including one or two or more kinds of the aforementioned material.

(Electron Transport Layer)

The electron transport layer includes an electron transport material which has a function of transporting electrons, and in broad sense, the electron transport layer includes an electron injection layer and a hole blocking layer. The electron transport layer can be formed as a monolayer or plural layers.

As for the material for electron transport, it is not particularly limited as long as it has a function of delivering the electrons injected from the negative electrode to the light emitting layer, and a known compound can be used. Examples of the material for electron transport include nitro-substituted fluorene derivatives, diphenylquinone derivatives, thiopyran dioxide derivatives, carbodimide, fluorenylidene methane derivatives, anthraquinodimethane, anthrone derivatives, oxadiazole derivatives, thiadiazole derivatives, and quinoxaline derivatives. Further, a polymeric material having the aforementioned material introduced to a polymer chain or having the aforementioned material as a main chain can be also used. Still further, a metal complex of 8-quinolinol derivatives such as tris(8-quinolinol)aluminum (Alq), tris(5,7-dichloro-8-quinolinol)aluminum, tris(5,7-di-bromo-8-quinolinol)aluminum, tris(2-methyl-8-quinolinol)aluminum, tris(5-methyl-8-quinolinol)aluminum, or bis(8-quinolinol)zinc (Znq), and a metal complex in which the center metal of the metal complex is substituted with In, Mg, Cu, Ca, Sn, Ga, or Pb can be also used. In addition to them, a metal free or metal phthalocyanine, or those having an end substituted with an alkyl group or a sulfonic acid group can be used. Further, an inorganic compound such as n type-Si or n type-SiC that can be a material of the hole injection layer can be also used.

The electron transport layer can be formed by a known method for obtaining a thin film such as a vacuum deposition method, a spin coating method, a casting method, a printing method including an inkjet method, and an LB method.

The film thickness of the electron transport layer is, although not particularly limited, generally 5 nm to 5 µm, and preferably 5 to 200 nm.

The electron transport layer can have a monolayer structure including one or two or more kinds of the aforementioned material.

(Method for Producing Organic EL Element)

With regard to methods for producing the organic EL element, descriptions are given by having an organic EL element including positive electrode/hole injection layer/hole transport layer/light emitting layer/electron transport layer/electron injection layer/negative electrode as an example.

By forming a thin film including a desired electrode material, for example, a material for positive electrode, on the functional film to have film thickness of 1 µm or less, and preferably 10 to 200 nm by a method such as vapor deposition, sputtering, or plasma CVD, a positive electrode is produced.

Next, on top of it, an organic compound thin film of the hole injection layer, hole transport layer, light emitting layer, electron transport layer, electron injection layer as a material of an organic EL element is formed. Examples of the method for forming an organic compound thin film include a vapor deposition method, a wet process (spin coating method, casting method, inkjet method, or printing method) or the like. However, from the viewpoint of obtaining an even film and difficulty having pin hole generation, or the like, it is preferable to use a vapor deposition method, a spin coating method, an inkjet method, or a printing method. In that case, a different film forming method can be used for each layer. When a vapor deposition method is used for film forming, although it may vary depending on the type of the compound to be used, conditions for vapor deposition may include the boat heating temperature of 50 to 450° C., vacuum degree of $10^{-6}$ to $10^{-2}$ Pa, vapor deposition rate of 0.01 to 50 nm/second, substrate temperature of −50 to 300° C., and film thickness of 0.1 nm to 5 µm, and preferably 5 to 200 nm.

After forming those layers, by forming a thin film including the materials for a negative electrode so as to have film thickness of 1 µm or less, and preferably 50 to 200 nm by a method such as vapor deposition and sputtering, the negative electrode can be formed, and thus the organic EL element can be produced.

With regard to the production of the organic EL element, the positive electrode, hole injection layer, and negative electrode are preferably produced only with single evacuation. However, it is also possible that they are extracted during the process and different film forming methods are performed. In that case, a care such as performing the operation under dry and inert gas atmosphere or the like is required. Further, the production can be performed in the reverse order, that is, in the order of a negative electrode, an electron injection layer, an electron transport layer, a light emitting layer, a hole transport layer, a hole injection layer, and a positive electrode.

When direct current voltage is applied to a multi-color display device (that is, organic EL panel) equipped with the organic EL element which is obtained from above, by having the positive electrode at positive polarity and the negative electrode at negative polarity and applying the voltage of 2 to 40 V, for example, light emission can be observed. Further, it is also possible that alternating current voltage is applied. Meanwhile, the form of the wave to be applied can be suitably selected.

EXAMPLES

Hereinbelow, the present invention is described in detail in view of Examples. However, the present invention is not limited to them. Meanwhile, in Examples, description of "parts" and "%" are used, and they indicate "parts by mass" or "% by mass", respectively, unless specifically described otherwise.

[Production of Resin Base Having Intermediate Layer (Bleed Out Preventing Layer)]

Cosmoshine A4300 (manufactured by Toyobo Co., Ltd.) which is a polyester film with 100 μm thickness having both surfaces treated with a process for easy adhesion was used as a resin base.

On one surface of the resin base, a coating liquid containing a UV curable organic/inorganic hybrid hard coat material OPSTAR Z7535 (manufactured by JSR Corporation) was applied using a wire bar so that a film thickness after drying is 4 μm. The obtained coating film was irradiated and cured by a high pressure mercury lamp to form a bleed out preventing layer. Meanwhile, the irradiation was performed in an air atmosphere at 1.0 J/cm$^2$ and 80° C. for 3 minutes.

[Preparation of Acrylic Acid Ester-Based Fine Resin Particles]

By using a four-neck flask with a volume of 500 mL equipped with a gas inlet tube, a refluxing condenser, a composite glass electrode for pH measurement, and a stirrer, a reactive emulsifying agent (phosphoric acid ester-based emulsifying agent) New Frontier A-229E (manufactured by Daiichi Kogyo Seiyaku Co., Ltd.) was dissolved in 200 g of distilled water such that it has a concentration of 5.0 g/100 mL and maintained at 50 to 60° C. As a polymerization monomer, 150 g of a mixed monomer obtained by mixing ethyl acrylate, methyl methacrylate, and glycidyl methacrylate at a weight mixing ratio of 60/40/2 was prepared, and 25 g of the mixture was first dispersed and emulsified in the solution. Maintaining a constant stirring state, an aqueous solution of copper sulfate was added thereto such that the concentration of copper sulfate becomes $5.0 \times 10^{-7}$ mol/L. By adding an equimolar mixture of potassium persulfate-sodium thiosulfate as a redox polymerization initiator such that it has a concentration of $3.0 \times 10^{-3}$ mol/L, the polymerization was initiated (temperature: 50 to 60° C., pH=4 to 7). The remaining mixed monomer (125 g) was gradually added dropwise thereto, and the polymerization was performed, in the meanwhile the temperature increase caused by polymerization heat was prevented. By having the polymerization time for 15 to 30 minutes, the acrylic acid ester-based fine resin particles were obtained.

[Preparation of First Coating Liquid]

To a sample tube having a volume of 50 g, 2.8 g of the acrylic acid ester-based fine resin particles prepared in the above, 8.5 g of 1-methoxy-2-propanol, and 3 g of ion exchange water were injected. Under stirring at 700 rpm, each of 0.3 g of acetic acid as a curing catalyst, 2 g of tetramethoxysilane as an alkoxysilane compound, and 0.1 g of 20% p-toluene sulfonic acid methanol solution as a curing catalyst was added over one minute in this order. After that, stirring was performed at room temperature for 10 minutes, and the resultant was obtained as the liquid A.

To a sample tube with a volume of 20 g, 2 g of methyltrimethoxysilane as an epoxysilane compound, 1 g of 1-methoxy-2-propanol, 0.4 g of 3-glycidoxypropyltrimethoxysilane, and 1.5 g of dimethoxyglycidoxypropylmethylsilane were injected. Then, stirring was performed at 500 rpm for 10 minutes, and the resultant was obtained as the liquid B.

After adding dropwise the liquid A to the liquid B over 2 minutes, they were stirred at room temperature and 700 rpm for 30 minutes. To the resulting mixture liquid, 0.8 g of 3-aminopropyltrimethoxysilane as an aminosilane compound was added dropwise over 2 minutes and stirred at room temperature for 24 hours. By keeping it for 1 week in a dark place at 25° C., the first coating liquid was prepared.

[Preparation of Second Coating Liquid]

The solution containing 20% by mass dibutyl ether solution of perhydropolysilazane (PHPS) (Aquamica NN120-20) and the solution containing 5% by mass amine catalyst (N,N,N',N'-tetramethyl-1,6-diaminohexane) (NAX120-20, manufactured by AZ Electronic Materials S.A.) were admixed with each other such that the content of the amine catalyst compared to the perhydropolysilazane (PHPS) concentration is 1.0% by mass, and thus the second coating liquid was prepared.

[Production of Functional Film (gas barrier film)]

Example 1

Forming Hybrid Layer

On a surface opposite to the bleed out preventing layer of the resin base which was prepared above, the first coating liquid was coated such that the film thickness after drying is 1 μm (1000 nm), and by performing a heating treatment at 120° C. for 30 minutes, a hybrid layer was formed.

Forming Functional Inorganic Layer

The second coating liquid was coated on top of the hybrid layer by spin coating and by drying it for one minute at 80° C., a coating film with thickness of 300 nm after drying was formed. At that time, the interface for measuring the thickness was determined from a photographic image of the cross section obtained by using a Transmission Electron Microscope (TEM).

By performing a modification treatment of the coating film based on vacuum ultraviolet (VUV) irradiation, a functional film in which the resin base-the hybrid layer-the functional inorganic layer are laminated in the order was produced. Meanwhile, for the vacuum ultraviolet (VUV) irradiation, a stage-operating type xenon excimer irradiation device MECL-M-1-200 (manufactured by M. D. Excimer Inc.) was used as a vacuum ultraviolet irradiation device, and after installing the sample such that the space (also referred to as a gap) between the lamp and the sample is 3 mm, the irradiation was performed according to the following conditions.

Illuminance: 140 mW/cm$^2$ (172 nm)
Stage temperature: 100° C.
Environment for treatment: under dry nitrogen gas
Oxygen concentration in environment for treatment: 0.1%
Stage operation rate and conveying number: conveying for 16 times at 10 mm/second Integrated amount of excimer light for exposure: 6000 mJ/cm².

At that time, the irradiation temperature was controlled by suitably modifying the moving rate of the movable stage. Further, the oxygen concentration at the time of vacuum ultraviolet irradiation was controlled by measuring the flow amount of nitrogen gas and oxygen gas that are introduced to the irradiation chamber by using a flow meter and based on the flow amount ratio of the nitrogen gas/oxygen gas in the gas to be introduced to the chamber.

Meanwhile, the ratio of the film thickness of the functional inorganic layer compared to the film thickness of the hybrid layer of the gas barrier film (that is, film thickness of the functional inorganic layer/film thickness of the hybrid layer), which was produced in Example 1, was 0.3.

Example 2

On a surface opposite to the bleed out preventing layer of the resin base which was produced above, the functional inorganic film was formed in the same manner as Example 1. Further, on top of the functional inorganic layer formed, the hybrid layer was formed in the same manner as Example 1 to produce a functional film in which the resin base-the functional inorganic layer-the hybrid layer are laminated in the order.

Example 3

According to the same method as Example 1, by further forming the hybrid layer on top of the functional inorganic layer of the functional film which was produced in Example 1, a functional film in which the resin base-the hybrid layer-the functional inorganic layer-the hybrid layer are laminated in the order was produced.

Example 4

Forming Hybrid Layer

On a surface opposite to the bleed out preventing layer of the resin base which was produced above, the first coating liquid was coated such that the film thickness after drying is 1 μm, and by performing a heating treatment at 120° C. for 1 minute followed by performing vacuum ultraviolet irradiation, a hybrid layer was formed. At that time, conditions for the vacuum ultraviolet irradiation were as follows.

Illuminance: 140 mW/cm² (172 nm)
Stage temperature: 100° C.
Environment for treatment: under dry nitrogen gas
Oxygen concentration in environment for treatment: 0.1%
Stage operation rate and conveying number: conveying for 3 times at 10 mm/second
Integrated amount of excimer light for exposure: 1200 mJ/cm².

Forming Functional Inorganic Layer

The second coating liquid was coated on top of the hybrid layer by spin coating and by drying it for one minute at 80° C., a coating film with thickness of 300 nm after drying was formed. Then, the coating film was subjected to a modification treatment by vacuum ultraviolet irradiation. By repeating the process again, the functional inorganic layer in which two layers are laminated were formed and the functional film in which the resin base-the hybrid layer-the functional inorganic layer (two layers) are laminated in the order was produced.

Meanwhile, the conditions for the vacuum ultraviolet irradiation are the same as those described in Example 1.

Example 5

On a surface opposite to the bleed out preventing layer of the resin base which was produced above, the functional inorganic layer (two layers) was formed in the same manner as Example 4. Further, the hybrid layer was formed on the formed functional inorganic layer in the same manner as Example 4 to produce the functional film in which the resin base—the functional inorganic layer (two layers)—the hybrid layer are laminated in the order.

Example 6

Except that the method for producing a functional inorganic layer is changed to an atmospheric pressure plasma CVD method (AGP method), a functional film in which the resin base-the hybrid layer-the functional inorganic layer are laminated in the order was produced in the same manner as Example 1. Meanwhile, the atmospheric pressure plasma CVD method was performed under the following conditions for forming a thin film by using a roll-to-roll type atmospheric pressure plasma film forming apparatus (for example, see FIG. 3 of JP-A No. 2008-56967).

Mixed Gas Composition
Discharge gas: nitrogen gas 94.9% by volume
Thin film forming gas: tetraethoxysilane 0.1% by volume
Gas for addition: Oxygen gas 5.0% by volume
Film Forming Conditions
<First Electrode Side>
Type of power source: PHF-6k 100 kHz (continuous mode) (manufactured by Haiden Laboratory Inc.)
Frequency: 100 kHz
Output density: 10 W/cm²
Electrode temperature: 120° C.
<Second Electrode Side>
Type of power source: CF-5000-13M 13.56 MHz (manufactured by Pearl Kogyo Co., Ltd.)
Frequency: 13.56 MHz
Output density: 10 W/cm²
Electrode temperature: 90° C.

Example 7

Except that the functional inorganic layer described in Example 2 is formed by the method of Example 6, a functional film in which the resin base-the functional inorganic layer-the hybrid layer are laminated in the order was produced in the same manner as Example 2.

Example 8

Except that the functional inorganic layer described in Example 3 is formed by the method of Example 6, a functional film in which the resin base-the hybrid layer-the functional inorganic layer-the hybrid layer are laminated in the order was produced in the same manner as Example 3.

Comparative Example 1

On the resin base produced above, the functional inorganic layer was formed in the same manner as Example 1, and thus a functional film in which the resin base-the functional inorganic layer are laminated in the order was produced.

Comparative Example 2

Except that the first coating liquid is changed to a solution in which 2 g of methylsilsesquioxane (MSQ) (manufactured by Konishi Chemical Ind. Co., Ltd.) are dissolved in methyl ethyl ketone (MEK), a functional film in which the resin base-the MSQ containing layer-the functional inorganic layer are laminated in the order was produced in the same manner as Example 1.

Comparative Example 3

Except that the first coating liquid is changed to a solution in which 2 g of methylsilsesquioxane (MSQ) (manufactured by Konishi Chemical Ind. Co., Ltd.) and 0.5 g of colloidal silica IPA-ST (manufactured by Nissan Chemical Industries, Ltd.) are dissolved in MEK, a functional film in which the resin base-the MSQ•colloidal silica containing layer-the functional inorganic layer are laminated in the order was produced in the same manner as Example 1.

Comparative Example 4

Except that the hybrid layer is changed to a urethane acrylate layer, which is obtained by coating, on a surface opposite to the bleed out preventing layer of the resin base, a solution containing UV curing type organic/inorganic hybrid hard coating material OPSTAR Z7501 (manufactured by JSR Corporation) such that the film thickness after drying is 1 µm followed by drying at 80° C. for 3 minutes and curing it in an air atmosphere at a curing condition of 1 J/cm$^2$ by using a high pressure mercury lamp, a functional film in which the resin base-the urethane acrylate layer-the functional inorganic layer are laminated in the order was produced in the same manner as Example 1.

Comparative Example 5

Except that the hybrid layer is changed to an acrylate layer, which is obtained by coating, on a surface opposite to the bleed out preventing layer of the resin base, an MEK solution containing 3.2 g of polymer type acrylate UNIDIC V-684 (manufactured by DIC Corporation) and 0.5 g of colloidal silica IPA-ST (manufactured by Nissan Chemical Industries, Ltd.) dissolved therein such that the film thickness after drying is 1 µm followed by drying at 80° C. for 3 minutes and curing it in an air atmosphere at a curing condition of 1 J/cm$^2$ by using a high pressure mercury lamp, a functional film in which the resin base-the acrylate layer-the functional inorganic layer are laminated in the order was produced in the same manner as Example 1.

Comparative Example 6

Except that the first coating liquid is changed to a solution in which 2 g of methylsilsesquioxane (MSQ) (manufactured by Konishi Chemical Ind. Co., Ltd.) is dissolved in MEK, a functional film in which the resin base-the functional inorganic layer-the MSQ containing layer are laminated in the order was produced in the same manner as Example 2.

Comparative Example 7

Except that the first coating liquid is changed to a solution in which 2 g of methylsilsesquioxane (MSQ) (manufactured by Konishi Chemical Ind. Co., Ltd.) and 0.5 g of colloidal silica IPA-ST (manufactured by Nissan Chemical Industries, Ltd.) are dissolved in MEK, a functional film in which the resin base-the functional inorganic layer-the MSQ•colloidal silica containing layer are laminated in the order was produced in the same manner as Example 2.

Comparative Example 8

Except that the hybrid layer is changed to a urethane acrylate layer, which is obtained by coating, on a surface opposite to the bleed out preventing layer of the resin base, a solution containing UV curing type organic/inorganic hybrid hard coating material OPSTAR Z7501 (manufactured by JSR Corporation) such that the film thickness after drying is 1 µm followed by drying at 80° C. for 3 minutes and curing it in an air atmosphere at a curing condition of 1 J/cm$^2$ by using a high pressure mercury lamp, a functional film in which the resin base-the functional inorganic layer-the urethane acrylate layer are laminated in the order was produced in the same manner as Example 2.

Comparative Example 9

Except that the hybrid layer is changed to an acrylate layer, which is obtained by coating, on a surface opposite to the bleed out preventing layer of the resin base, an MEK solution containing 3.2 g of polymer type acrylate UNIDIC V-684 (manufactured by DIC Corporation) and 0.5 g of colloidal silica IPA-ST (manufactured by Nissan Chemical Industries, Ltd.) dissolved therein such that the film thickness after drying is 1 µm followed by drying at 80° C. for 3 minutes and curing it in an air atmosphere at a curing condition of 1 J/cm$^2$ by using a high pressure mercury lamp, a functional film in which the resin base-the acrylate layer-the functional inorganic layer are laminated in the order was produced in the same manner as Example 2.

Example 9

Except that the second coating liquid is coated such that the film thickness of the functional inorganic layer is 500 nm, a functional film in which the resin base-the hybrid layer-the functional inorganic layer are laminated in the order was produced in the same manner as Example 1.

Meanwhile, the ratio of the film thickness of the functional inorganic layer compared to the film thickness of the hybrid layer of the functional film produced in Example 9 (film thickness of the functional inorganic layer/film thickness of the hybrid layer) is 0.5.

Example 10

Except that the second coating liquid is coated such that the film thickness of the functional inorganic layer is 600 nm, a functional film in which the resin base-the hybrid layer-the functional inorganic layer are laminated in the order was produced in the same manner as Example 1.

Meanwhile, the ratio of the film thickness of the functional inorganic layer compared to the film thickness of the hybrid layer of the functional film produced in Example 10 (film thickness of the functional inorganic layer/film thickness of the hybrid layer) is 0.6.

Example 11

Except that the second coating liquid is coated such that the film thickness of the functional inorganic layer is 700 nm, a functional film in which the resin base-the hybrid layer-the functional inorganic layer are laminated in the order was produced in the same manner as Example 1.

Meanwhile, the ratio of the film thickness of the functional inorganic layer compared to the film thickness of the hybrid layer of the functional film produced in Example 11 (film thickness of the functional inorganic layer/film thickness of the hybrid layer) is 0.7.

Example 12

Except that the second coating liquid is coated such that the film thickness of the functional inorganic layer is 1000 nm, a functional film in which the resin base-the hybrid layer-the functional inorganic layer are laminated in the order was produced in the same manner as Example 1.

Meanwhile, the ratio of the film thickness of the functional inorganic layer compared to the film thickness of the hybrid layer of the functional film produced in Example 12 (film thickness of the functional inorganic layer/film thickness of the hybrid layer) is 100.

Example 13

Except that the second coating liquid is coated such that the film thickness of the functional inorganic layer is 1100 nm, a functional film in which the resin base-the hybrid layer-the functional inorganic layer are laminated in the order was produced in the same manner as Example 1.

Meanwhile, the ratio of the film thickness of the functional inorganic layer compared to the film thickness of the hybrid layer of the functional film produced in Example 13 (film thickness of the functional inorganic layer/film thickness of the hybrid layer) is 1.1.

Example 14

Except that the second coating liquid is coated such that the film thickness of the functional inorganic layer is 90 nm, a functional film in which the resin base-the hybrid layer-the functional inorganic layer are laminated in the order was produced in the same manner as Example 1.

Meanwhile, the ratio of the film thickness of the functional inorganic layer compared to the film thickness of the hybrid layer of the functional film produced in Example 14 (film thickness of the functional inorganic layer/film thickness of the hybrid layer) is 0.09.

Example 15

Except that the second coating liquid is coated such that the film thickness of the functional inorganic layer is 9 nm, a functional film in which the resin base-the hybrid layer-the functional inorganic layer are laminated in the order was produced in the same manner as Example 1.

Meanwhile, the ratio of the film thickness of the functional inorganic layer compared to the film thickness of the hybrid layer of the functional film produced in Example 15 (film thickness of the functional inorganic layer/film thickness of the hybrid layer) is 0.009.

Example 16

Except that the first coating liquid is coated such that the film thickness of the hybrid layer is 5000 nm, a functional film in which the resin base-the hybrid layer-the functional inorganic layer are laminated in the order was produced in the same manner as Example 1.

Meanwhile, the ratio of the film thickness of the functional inorganic layer compared to the film thickness of the hybrid layer of the functional film produced in Example 16 (film thickness of the functional inorganic layer/film thickness of the hybrid layer) is 0.06.

Example 17

Except that the first coating liquid is coated such that the film thickness of the hybrid layer is 5000 nm, a functional film in which the resin base-the hybrid layer-the functional inorganic layer are laminated in the order was produced in the same manner as Example 9.

Meanwhile, the ratio of the film thickness of the functional inorganic layer compared to the film thickness of the hybrid layer of the functional film produced in Example 17 (film thickness of the functional inorganic layer/film thickness of the hybrid layer) is 0.10.

Example 18

Except that the first coating liquid is coated such that the film thickness of the hybrid layer is 5000 nm, a functional film in which the resin base-the hybrid layer-the functional inorganic layer are laminated in the order was produced in the same manner as Example 10.

Meanwhile, the ratio of the film thickness of the functional inorganic layer compared to the film thickness of the hybrid layer of the functional film produced in Example 18 (film thickness of the functional inorganic layer/film thickness of the hybrid layer) is 0.12.

Example 19

Except that the first coating liquid is coated such that the film thickness of the hybrid layer is 5000 nm and the second coating liquid is coated such that the film thickness of the functional inorganic layer is 4800 nm, a functional film in which the resin base-the hybrid layer-the functional inorganic layer are laminated in the order was produced in the same manner as Example 1.

Meanwhile, the ratio of the film thickness of the functional inorganic layer compared to the film thickness of the hybrid layer of the functional film produced in Example 19 (film thickness of the functional inorganic layer/film thickness of the hybrid layer) is 0.96.

Example 20

Except that the first coating liquid is coated such that the film thickness of the hybrid layer is 10000 nm, a functional film in which the resin base-the hybrid layer-the functional inorganic layer are laminated in the order was produced in the same manner as Example 14.

Meanwhile, the ratio of the film thickness of the functional inorganic layer compared to the film thickness of the hybrid layer of the functional film produced in Example 20 (film thickness of the functional inorganic layer/film thickness of the hybrid layer) is 0.009.

Example 21

Except that the first coating liquid is coated such that the film thickness of the hybrid layer is 10000 nm, a functional film in which the resin base-the hybrid layer-the functional inorganic layer are laminated in the order was produced in the same manner as Example 10.

Example 22

Except that the first coating liquid is coated such that the film thickness of the hybrid layer is 10000 nm and the second coating liquid is coated such that the film thickness of the functional inorganic layer is 900 nm, a functional film in which the resin base-the hybrid layer-the functional inorganic layer are laminated in the order was produced in the same manner as Example 1.

Meanwhile, the ratio of the film thickness of the functional inorganic layer compared to the film thickness of the hybrid layer of the functional film produced in Example 22 (film thickness of the functional inorganic layer/film thickness of the hybrid layer) is 0.09.

Example 23

Except that the first coating liquid is coated such that the film thickness of the hybrid layer is 10000 nm, a functional film in which the resin base-the hybrid layer-the functional inorganic layer are laminated in the order was produced in the same manner as Example 12.

Meanwhile, the ratio of the film thickness of the functional inorganic layer compared to the film thickness of the hybrid layer of the functional film produced in Example 23 (film thickness of the functional inorganic layer/film thickness of the hybrid layer) is 0.10.

Example 24

Except that the first coating liquid is coated such that the film thickness of the hybrid layer is 10000 nm and the second coating liquid is coated such that the film thickness of the functional inorganic layer is 9000 nm, a functional film in which the resin base-the hybrid layer-the functional inorganic layer are laminated in the order was produced in the same manner as Example 1.

Meanwhile, the ratio of the film thickness of the functional inorganic layer compared to the film thickness of the hybrid layer of the functional film produced in Example 24 (film thickness of the functional inorganic layer/film thickness of the hybrid layer) is 0.9.

Example 25

Except that the first coating liquid is coated such that the film thickness of the hybrid layer is 10000 nm and the second coating liquid is coated such that the film thickness of the functional inorganic layer is 11000 nm, a functional film in which the resin base-the hybrid layer-the functional inorganic layer are laminated in the order was produced in the same manner as Example 1.

Meanwhile, the ratio of the film thickness of the functional inorganic layer compared to the film thickness of the hybrid layer of the functional film produced in Example 25 (film thickness of the functional inorganic layer/film thickness of the hybrid layer) is 1.1.

Example 26

Except that the second coating liquid is coated such that the film thickness of the functional inorganic layer is 500 nm, a functional film in which the resin base-the functional inorganic layer-the hybrid layer are laminated in the order was produced in the same manner as Example 2.

Meanwhile, the ratio of the film thickness of the functional inorganic layer compared to the film thickness of the hybrid layer of the functional film produced in Example 26 (film thickness of the functional inorganic layer/film thickness of the hybrid layer) is 0.5.

Example 27

Except that the second coating liquid is coated such that the film thickness of the functional inorganic layer is 600 nm, a functional film in which the resin base-the functional inorganic layer-the hybrid layer are laminated in the order was produced in the same manner as Example 2.

Meanwhile, the ratio of the film thickness of the functional inorganic layer compared to the film thickness of the hybrid layer of the functional film produced in Example 27 (film thickness of the functional inorganic layer/film thickness of the hybrid layer) is 0.6.

Example 28

Except that the second coating liquid is coated such that the film thickness of the functional inorganic layer is 700 nm, a functional film in which the resin base-the functional inorganic layer-the hybrid layer are laminated in the order was produced in the same manner as Example 2.

Meanwhile, the ratio of the film thickness of the functional inorganic layer compared to the film thickness of the hybrid layer of the functional film produced in Example 28 (film thickness of the functional inorganic layer/film thickness of the hybrid layer) is 0.7.

Example 29

Except that the second coating liquid is coated such that the film thickness of the functional inorganic layer is 1000 nm, a functional film in which the resin base-the functional inorganic layer-the hybrid layer are laminated in the order was produced in the same manner as Example 2.

Meanwhile, the ratio of the film thickness of the functional inorganic layer compared to the film thickness of the hybrid layer of the functional film produced in Example 29 (film thickness of the functional inorganic layer/film thickness of the hybrid layer) is 1.0.

Example 30

Except that the second coating liquid is coated such that the film thickness of the functional inorganic layer is 1100 nm, a functional film in which the resin base-the functional inorganic layer-the hybrid layer are laminated in the order was produced in the same manner as Example 2.

Meanwhile, the ratio of the film thickness of the functional inorganic layer compared to the film thickness of the hybrid layer of the functional film produced in Example 30 (film thickness of the functional inorganic layer/film thickness of the hybrid layer) is 1.1.

Example 31

Except that the second coating liquid is coated such that the film thickness of the functional inorganic layer is 90 nm, a functional film in which the resin base-the functional inorganic layer-the hybrid layer are laminated in the order was produced in the same manner as Example 2.

Meanwhile, the ratio of the film thickness of the functional inorganic layer compared to the film thickness of the hybrid layer of the functional film produced in Example 31 (film thickness of the functional inorganic layer/film thickness of the hybrid layer) is 0.09.

Example 32

Except that the second coating liquid is coated such that the film thickness of the functional inorganic layer is 9 nm, a functional film in which the resin base-the functional inorganic layer-the hybrid layer are laminated in the order was produced in the same manner as Example 2.

Meanwhile, the ratio of the film thickness of the functional inorganic layer compared to the film thickness of the hybrid layer of the functional film produced in Example 32 (film thickness of the functional inorganic layer/film thickness of the hybrid layer) is 0.009.

Example 33

Except that the second coating liquid is coated such that the film thickness of the functional inorganic layer is 500 nm, a functional film in which the resin base-the hybrid layer-the functional inorganic layer-the hybrid layer are laminated in the order was produced in the same manner as Example 3.

Meanwhile, the ratio of the film thickness of the functional inorganic layer compared to the film thickness of the hybrid layer of the functional film produced in Example 33 (film thickness of the functional inorganic layer/film thickness of the hybrid layer) is 0.5.

Example 34

Except that the second coating liquid is coated such that the film thickness of the functional inorganic layer is 600 nm, a functional film in which the resin base-the hybrid layer-the functional inorganic layer-the hybrid layer are laminated in the order was produced in the same manner as Example 3.

Meanwhile, the ratio of the film thickness of the functional inorganic layer compared to the film thickness of the hybrid layer of the functional film produced in Example 34 (film thickness of the functional inorganic layer/film thickness of the hybrid layer) is 0.6.

Example 35

Except that the second coating liquid is coated such that the film thickness of the functional inorganic layer is 700 nm, a functional film in which the resin base-the hybrid layer-the functional inorganic layer-the hybrid layer are laminated in the order was produced in the same manner as Example 3.

Meanwhile, the ratio of the film thickness of the functional inorganic layer compared to the film thickness of the hybrid layer of the functional film produced in Example 35 (film thickness of the functional inorganic layer/film thickness of the hybrid layer) is 0.7.

Example 36

Except that the second coating liquid is coated such that the film thickness of the functional inorganic layer is 1000 nm, a functional film in which the resin base-the hybrid layer-the functional inorganic layer-the hybrid layer are laminated in the order was produced in the same manner as Example 3.

Meanwhile, the ratio of the film thickness of the functional inorganic layer compared to the film thickness of the hybrid layer of the functional film produced in Example 36 (film thickness of the functional inorganic layer/film thickness of the hybrid layer) is 1.0.

Example 37

Except that the second coating liquid is coated such that the film thickness of the functional inorganic layer is 1100 nm, a functional film in which the resin base-the hybrid layer-the functional inorganic layer-the hybrid layer are laminated in the order was produced in the same manner as Example 3.

Meanwhile, the ratio of the film thickness of the functional inorganic layer compared to the film thickness of the hybrid layer of the functional film produced in Example 37 (film thickness of the functional inorganic layer/film thickness of the hybrid layer) is 1.1.

Example 38

Except that the second coating liquid is coated such that the film thickness of the functional inorganic layer is 90 nm, a functional film in which the resin base-the hybrid layer-the functional inorganic layer-the hybrid layer are laminated in the order was produced in the same manner as Example 3.

Meanwhile, the ratio of the film thickness of the functional inorganic layer compared to the film thickness of the hybrid layer of the functional film produced in Example 38 (film thickness of the functional inorganic layer/film thickness of the hybrid layer) is 0.09.

Example 39

Except that the second coating liquid is coated such that the film thickness of the functional inorganic layer is 9 nm, a functional film in which the resin base-the hybrid layer-the functional inorganic layer-the hybrid layer are laminated in the order was produced in the same manner as Example 3.

Meanwhile, the ratio of the film thickness of the functional inorganic layer compared to the film thickness of the hybrid layer of the functional film produced in Example 39 (film thickness of the functional inorganic layer/film thickness of the hybrid layer) is 0.009.

Example 40

Except that the first coating liquid is coated such that the film thickness of the hybrid layer is 5000 nm, a functional film in which the resin base-the hybrid layer-the functional inorganic layer-the hybrid layer are laminated in the order was produced in the same manner as Example 3.

Meanwhile, the ratio of the film thickness of the functional inorganic layer compared to the film thickness of the hybrid layer of the functional film produced in Example 40 (film thickness of the functional inorganic layer/film thickness of the hybrid layer) is 0.06.

Example 41

Except that the first coating liquid is coated such that the film thickness of the hybrid layer is 5000 nm, a functional film in which the resin base-the hybrid layer-the functional inorganic layer-the hybrid layer are laminated in the order was produced in the same manner as Example 33.

Meanwhile, the ratio of the film thickness of the functional inorganic layer compared to the film thickness of the hybrid layer of the functional film produced in Example 41 (film thickness of the functional inorganic layer/film thickness of the hybrid layer) is 0.1.

Example 42

Except that the first coating liquid is coated such that the film thickness of the hybrid layer is 5000 nm, a functional film in which the resin base-the hybrid layer-the functional inorganic layer-the hybrid layer are laminated in the order was produced in the same manner as Example 34.

Meanwhile, the ratio of the film thickness of the functional inorganic layer compared to the film thickness of the hybrid layer of the functional film produced in Example 42 (film thickness of the functional inorganic layer/film thickness of the hybrid layer) is 0.12.

Example 43

Except that the first coating liquid is coated such that the film thickness of the hybrid layer is 5000 nm and the second coating liquid is coated such that the film thickness of the functional inorganic layer is 4800 nm, a functional film in which the resin base-the hybrid layer-the functional inorganic layer-the hybrid layer are laminated in the order was produced in the same manner as Example 3.

Meanwhile, the ratio of the film thickness of the functional inorganic layer compared to the film thickness of the hybrid layer of the functional film produced in Example 43 (film thickness of the functional inorganic layer/film thickness of the hybrid layer) is 0.96.

Example 44

Except that the first coating liquid is coated such that the film thickness of the hybrid layer is 10000 nm and the second coating liquid is coated such that the film thickness of the functional inorganic layer is 90 nm, a functional film in which the resin base-the hybrid layer-the functional inorganic layer-the hybrid layer are laminated in the order was produced in the same manner as Example 3.

Meanwhile, the ratio of the film thickness of the functional inorganic layer compared to the film thickness of the hybrid layer of the functional film produced in Example 44 (film thickness of the functional inorganic layer/film thickness of the hybrid layer) is 0.009.

Example 45

Except that the first coating liquid is coated such that the film thickness of the hybrid layer is 10000 nm, a functional film in which the resin base-the hybrid layer-the functional inorganic layer-the hybrid layer are laminated in the order was produced in the same manner as Example 34.

Meanwhile, the ratio of the film thickness of the functional inorganic layer compared to the film thickness of the hybrid layer of the functional film produced in Example 45 (film thickness of the functional inorganic layer/film thickness of the hybrid layer) is 0.12.

Example 46

Except that the first coating liquid is coated such that the film thickness of the hybrid layer is 10000 nm and the second coating liquid is coated such that the film thickness of the functional inorganic layer is 900 nm, a functional film in which the resin base-the hybrid layer-the functional inorganic layer-the hybrid layer are laminated in the order was produced in the same manner as Example 3.

Meanwhile, the ratio of the film thickness of the functional inorganic layer compared to the film thickness of the hybrid layer of the functional film produced in Example 46 (film thickness of the functional inorganic layer/film thickness of the hybrid layer) is 0.09.

Example 47

Except that the first coating liquid is coated such that the film thickness of the hybrid layer is 10000 nm, a functional film in which the resin base-the hybrid layer-the functional inorganic layer-the hybrid layer are laminated in the order was produced in the same manner as Example 36.

Meanwhile, the ratio of the film thickness of the functional inorganic layer compared to the film thickness of the hybrid layer of the functional film produced in Example 47 (film thickness of the functional inorganic layer/film thickness of the hybrid layer) is 0.1.

Example 48

Except that the first coating liquid is coated such that the film thickness of the hybrid layer is 10000 nm and the second coating liquid is coated such that the film thickness of the functional inorganic layer is 9000 nm, a functional film in which the resin base-the hybrid layer-the functional inorganic layer-the hybrid layer are laminated in the order was produced in the same manner as Example 3.

Meanwhile, the ratio of the film thickness of the functional inorganic layer compared to the film thickness of the hybrid layer of the functional film produced in Example 48 (film thickness of the functional inorganic layer/film thickness of the hybrid layer) is 0.9.

Example 49

Except that the first coating liquid is coated such that the film thickness of the hybrid layer is 10000 nm and the second coating liquid is coated such that the film thickness of the functional inorganic layer is 11000 nm, a functional film in which the resin base-the hybrid layer-the functional inorganic layer-the hybrid layer are laminated in the order was produced in the same manner as Example 3.

Meanwhile, the ratio of the film thickness of the functional inorganic layer compared to the film thickness of the hybrid layer of the functional film produced in Example 49 (film thickness of the functional inorganic layer/film thickness of the hybrid layer) is 1.1.

The constitution of the functional films which were produced in above Examples 1 to 8 and Comparative Examples 1 to 9 are shown in the following Table 1.

TABLE 1

| | | Hybrid layer | | | Functional inorganic layer | | Hybrid layer | | |
|---|---|---|---|---|---|---|---|---|---|
| | Base | Binder | Particles | Forming method | Materials | Forming method | Binder | Particles | Forming method |
| Example 1 | Resin base | Polysiloxane | Fine resin particles | Heating | PHPS | VUV irradiation | — | — | — |
| Example 2 | Resin base | — | — | — | PHPS | VUV irradiation | Polysiloxane | Fine resin particles | Heating |
| Example 3 | Resin base | Polysiloxane | Fine resin particles | Heating | PHPS | VUV irradiation | Polysiloxane | Fine resin particles | Heating |
| Example 4 | Resin base | Polysiloxane | Fine resin particles | VUV irradiation | PHPS (two layers) | VUV irradiation | — | — | — |
| Example 5 | Resin base | Polysiloxane | Fine resin particles | VUV irradiation | PHPS (two layers) | VUV irradiation | Polysiloxane | Fine resin particles | VUV irradiation |
| Example 6 | Resin base | Polysiloxane | Fine resin particles | Heating | TEOS | AGP | — | — | — |
| Example 7 | Resin base | — | — | — | TEOS | AGP | Polysiloxane | Fine resin particles | Heating |
| Example 8 | Resin base | Polysiloxane | Fine resin particles | Heating | TEOS | AGP | Polysiloxane | Fine resin particles | Heating |
| Comparative Example 1 | Resin base | — | — | — | PHPS | VUV irradiation | — | — | — |
| Comparative Example 2 | Resin base | MSQ | — | Heating | PHPS | VUV irradiation | — | — | — |
| Comparative Example 3 | Resin base | MSQ | Silica | Heating | PHPS | VUV irradiation | — | — | — |
| Comparative Example 4 | Resin base | Urethane acrylate | — | UV irradiation | PHPS | VUV irradiation | — | — | — |
| Comparative Example 5 | Resin base | Acrylate | Silica | UV irradiation | PHPS | VUV irradiation | — | — | — |
| Comparative Example 6 | Resin base | — | — | — | PHPS | VUV irradiation | MSQ | — | Heating |
| Comparative Example 7 | Resin base | — | — | — | PHPS | VUV irradiation | MSQ | Silica | Heating |
| Comparative Example 8 | Resin base | — | — | — | PHPS | VUV irradiation | Urethane acrylate | — | UV |
| Comparative Example 9 | Resin base | — | — | — | PHPS | VUV irradiation | Acrylate | Silica | UV irradiation |

PHPS: perhydropolysilazane
TEOS: tetraethoxysilane
MSQ: methylsilsesquioxane
VUV irradiation: vacuum ultraviolet irradiation
AGP: atmospheric pressure gas plasma
UV irradiation: irradiation using high pressure mercury lamp Further, constitution of the functional films which were produced in Example 1 and Examples 9 to 25, Example 2 and Examples 26 to 32, and Example 3 and Examples 33 to 49 are shown in the following Tables 2 to 4.

TABLE 2

| | Film thickness of hybrid layer (nm) | Film thickness of functional inorganic layer (nm) | Film thickness of hybrid layer (nm) | Film thickness ratio |
|---|---|---|---|---|
| Example 1 | 1000 | 300 | — | 0.3 |
| Example 9 | 1000 | 500 | — | 0.5 |
| Example 10 | 1000 | 600 | — | 0.6 |
| Example 11 | 1000 | 700 | — | 0.7 |
| Example 12 | 1000 | 1000 | — | 1 |
| Example 13 | 1000 | 1100 | — | 1.1 |
| Example 14 | 1000 | 90 | — | 0.09 |
| Example 15 | 1000 | 9 | — | 0.009 |
| Example 16 | 5000 | 300 | — | 0.06 |
| Example 17 | 5000 | 500 | — | 0.1 |
| Example 18 | 5000 | 600 | — | 0.12 |
| Example 19 | 5000 | 4800 | — | 0.96 |
| Example 20 | 10000 | 90 | — | 0.009 |
| Example 21 | 10000 | 600 | — | 0.06 |
| Example 22 | 10000 | 900 | — | 0.09 |
| Example 23 | 10000 | 1000 | — | 0.1 |
| Example 24 | 10000 | 9000 | — | 0.9 |
| Example 25 | 10000 | 11000 | — | 1.1 |

*Film thickness ratio = Film thickness of functional inorganic layer (nm)/Film thickness of hybrid layer (nm)

TABLE 3

| | Film thickness of hybrid layer (nm) | Film thickness of functional inorganic layer (nm) | Film thickness of hybrid layer (nm) | Film thickness ratio |
|---|---|---|---|---|
| Example 2 | — | 300 | 1000 | 0.3 |
| Example 26 | — | 500 | 1000 | 0.5 |
| Example 27 | — | 600 | 1000 | 0.6 |
| Example 28 | — | 700 | 1000 | 0.7 |
| Example 29 | — | 1000 | 1000 | 1 |
| Example 30 | — | 1100 | 1000 | 1.1 |
| Example 31 | — | 90 | 1000 | 0.09 |
| Example 32 | — | 9 | 1000 | 0.009 |

*Film thickness ratio = Film thickness of functional inorganic layer (nm)/Film thickness of hybrid layer (nm)

TABLE 4

| | Film thickness of hybrid layer (nm) | Film thickness of functional inorganic layer (nm) | Film thickness of hybrid layer (nm) | Film thickness ratio |
|---|---|---|---|---|
| Example 3 | 1000 | 300 | 1000 | 0.3 |
| Example 33 | 1000 | 500 | 1000 | 0.5 |
| Example 34 | 1000 | 600 | 1000 | 0.6 |
| Example 35 | 1000 | 700 | 1000 | 0.7 |
| Example 36 | 1000 | 1000 | 1000 | 1 |
| Example 37 | 1000 | 1100 | 1000 | 1.1 |
| Example 38 | 1000 | 90 | 1000 | 0.09 |
| Example 39 | 1000 | 9 | 1000 | 0.009 |
| Example 40 | 5000 | 300 | 5000 | 0.06 |
| Example 41 | 5000 | 500 | 5000 | 0.1 |
| Example 42 | 5000 | 600 | 5000 | 0.12 |
| Example 43 | 5000 | 4800 | 5000 | 0.96 |
| Example 44 | 10000 | 90 | 10000 | 0.009 |
| Example 45 | 10000 | 600 | 10000 | 0.06 |
| Example 46 | 10000 | 900 | 10000 | 0.09 |
| Example 47 | 10000 | 1000 | 10000 | 0.1 |
| Example 48 | 10000 | 9000 | 10000 | 0.9 |
| Example 49 | 10000 | 11000 | 10000 | 1.1 |

*Film thickness ratio = Film thickness of functional inorganic layer (nm)/Film thickness of hybrid layer (nm)

Production of Organic EL Element

Production Example 1

By using the functional film produced in Example 1 described above, an organic EL element was produced.

Formation of Transparent Conductive Film

By using an apparatus of parallel plate type electrodes as a plasma discharge device, the functional film of Example 1 was placed between the electrodes, to which mixed gas was introduced so as to forma thin film. In addition, as an earth (ground) electrode, the following was used. Specifically, an electrode that was obtained by coating an alumina sprayed film that has high density and high adhesion, on a stainless steel plate of 200 mm×200 mm×2 mm, then by applying a solution in which tetramethoxysilane was diluted with ethyl acetate and drying the applied solution, then by curing the dried resultant with ultraviolet irradiation so as to perform a sealing treatment, by polishing and smoothing the surface of the dielectric body that was subjected to the sealing treatment, and by processing the resultant so that $R_{max}$ is 5 μm, was used. Further, as an application electrode, an electrode that was obtained by coating dielectric body to a hollow square pure titanium pipe under the same conditions as those of the earth electrode was used. Multiple electrodes of the application electrode were produced, and were provided so as to be opposed to the earth electrode to forma discharge space. In addition, by using a high frequency power source, CF-5000-13M (manufactured by PEARL KOGYO Co., Ltd.) as a power source used in plasma generation, electric power at a frequency of 13.56 MHz and 5 W/cm² was supplied.

Further, a mixed gas of the following composition was filled between electrodes so as to be in a plasma state, the functional film was subjected to an atmospheric pressure plasma treatment, an indium tin oxide (ITO) film was formed at a thickness of 100 nm on the intermediate layer, and thus the one on which a transparent conductive film was formed was obtained.

Discharge gas: helium 98.5% by volume

Reactive gas 1: oxygen 0.25% by volume

Reactive gas 2: indium acetylacetonate 1.2% by volume

Reactive gas 3: dibutyl tin diacetate 0.05% by volume

Production of Organic EL Element

A 100 mm×80 mm of the obtained transparent conductive film was used as a functional film substrate, to which patterning was performed, and then the functional film substrate in which this ITO transparent electrode was provided was subjected to ultrasonic cleaning with isopropyl alcohol, and the resultant substrate was dried with dry nitrogen gas. This functional film substrate was fixed on a substrate holder of a vacuum deposition apparatus that is commercially available. Meanwhile, 200 mg of α-NPD was placed in a resistive heating molybdenum boat, 200 mg of CBP was placed as a host compound in another resistive heating molybdenum boat, 200 mg of bathocuproine (BCP) was placed in another resistive heating molybdenum boat, 100 mg of Ir-1 was placed in another resistive heating molybdenum boat, and 200 mg of Alq₃ was placed in another resistive heating molybdenum boat, and then they were installed in the vacuum deposition apparatus.

[Chem. 5]

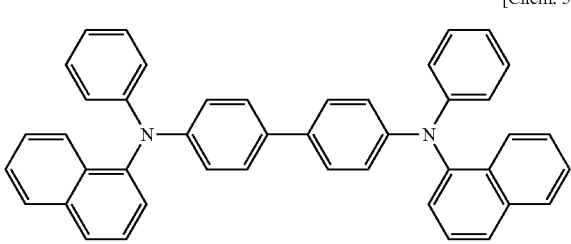

α-NPD

[Chem. 6]

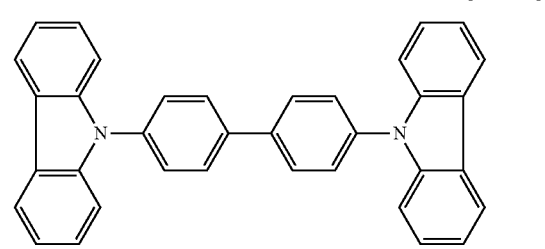

CBP

[Chem. 7]

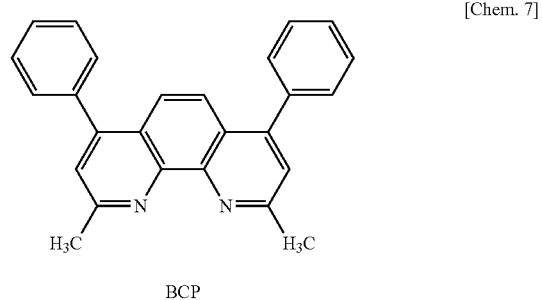

BCP

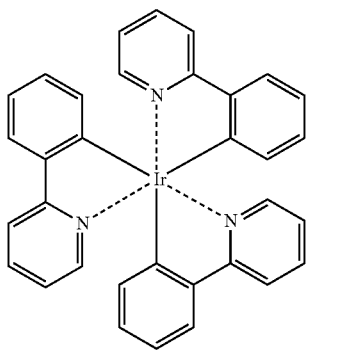

Ir-1

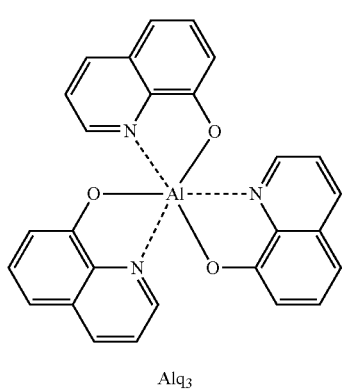

Alq₃

Subsequently, the pressure in the vacuum chamber was lowered to $4 \times 10^{-4}$ Pa, then the above-described heating boat containing α-NPD was heated by allowing electric current to flow, and then vapor-deposited on a functional film substrate at a deposition rate of 0.1 nm/sec to have an area of 80 mm×60 mm in the center, and thus a hole transport layer was formed. Further, the above-described heating boat containing CBP and Ir-1 were heated by allowing electric current to flow, and then were co-deposited on the hole transport layer at a deposition rate of 0.2 nm/sec, and 0.012 nm/sec, respectively to form a light emitting layer. Meanwhile, the temperature of the functional film substrate during the vapor deposition was room temperature. Further, the above-described heating boat containing BCP was heated by allowing electric current to flow, and then vapor-deposited on the above-described light emitting layer at a deposition rate of 0.1 nm/sec to form a hole blocking layer having a film thickness of 10 nm. Thereon, furthermore, the above-described heating boat containing Alq₃ was heated by allowing electric current to flow, and then vapor-deposited on the hole blocking layer at a deposition rate of 0.1 nm/sec to form an electron transporting layer having a film thickness of 40 nm. Meanwhile, the temperature of the functional film substrate during the vapor deposition was room temperature.

Subsequently, 0.5 nm of lithium fluoride and 110 nm of aluminum were vapor-deposited to form a negative electrode, and an organic EL element attached with a transparent conductive film was produced. The organic EL element was subjected to sealing. The sealing was performed as follows. In an environment that was purged with nitrogen gas (inert gas), an aluminum deposited surface of the organic EL element sample, and aluminum foil having a thickness of 100 μm were attached by attaching four sides of the base end, each with width of 10 mm, by using an epoxy-based adhesives (manufactured by Nagase ChemteX Corporation) so that the aluminum deposited surface and the aluminum foil are opposed to each other.

An organic EL element was produced in the same manner with the functional films of Examples 2 to 49 and Comparative Examples 1 to 9.

[Evaluation]

(Evaluation of Functional Film)

The functional film was subjected to a gas barrier property (water vapor barrier property) evaluation.

1. Untreated Functional Film

Evaluation of Water Vapor Barrier Property

By using a vacuum deposition apparatus JEE-400 (manufactured by JEOL, Ltd.), metal calcium (particulate phase) as a metal which is corroded by reaction with moisture was deposited on a surface of the functional film produced. After that, under dry nitrogen gas atmosphere, quartz glass having a thickness of 0.2 mm was attached onto the metal calcium vapor-deposited surface using an ultraviolet curing resin for sealing (manufactured by Nagase ChemteX Co., Ltd.), and ultraviolet rays were irradiated for curing and main sealing of the ultraviolet curing resin. As a result, a cell for evaluating a water vapor barrier property was produced.

By using the produced cell for evaluating a water vapor barrier property, the water vapor permeation amount of the functional film was evaluated from the corrosion amount of metal calcium. Meanwhile, in order to confirm the absence of permeation of water vapor from the region other than the functional film surface (quartz glass surface or the like), a comparative sample using a quartz glass plate with a thickness of 0.2 mm instead of the functional film sample was produced and stored at high temperature and high humidity conditions of 60° C. and 90% RH. In case of the comparative sample, it was confirmed that no corrosion of metal calcium occurs even after 3000 hours.

Evaluation of Propagation Rate of Corroded Spots

The cell for evaluating a water vapor barrier property was stored at high temperature and high humidity conditions of 60° C. and 90% RH by using the constant temperature and humidity oven Yamato Humidic Chamber IG47M. By observing the propagation rate of corroded spots in the calcium-deposited area, evaluation of propagation rate of corroded spots was performed. The evaluation of propagation rate of corroded spots was performed according to the following criteria.

5: Absolutely no corroded spots are observed in the calcium-deposited area which was sealed with the film, or the time to reach the corroded area of 5.0% is 2000 hours or more.

4: In the calcium-deposited area which was sealed with the film, the time to reach the corroded area of 5.0% is 1000 hours or longer but less than 2000 hours.

3: In the calcium-deposited area which was sealed with the film, the time to reach the corroded area of 5.0% is 500 hours or longer but less than 1000 hours.

2: In the calcium-deposited area which was sealed with the film, the time to reach the corroded area of 5.0% is 100 hours or longer but less than 500 hours.

1: In the calcium-deposited area which was sealed with the film, the time to reach the corroded area of 5.0% is less than 100 hours, or the propagation rate of corroded spots cannot be determined as the corrosion progresses so rapidly.

Evaluation of Peripheral Shrinkage Amount

The cell for evaluating a water vapor barrier property was stored at high temperature and high humidity conditions of 60° C. and 90% RH by using the constant temperature and humidity oven Yamato Humidic Chamber IG47M. By observing the shrinkage in an area with residual calcium vapor deposition, which is accompanied with the propagation of calcium-corroded area in the peripheral region of the element, evaluation of peripheral shrinkage amount was performed. The evaluation of corroded area was performed according to the following criteria.

5: Absolutely no area shrinkage from the peripheral region is observed in the calcium-deposited area which was sealed with the film, or the time to reach the corroded area of 5.0% as caused by shrinkage from the peripheral region is 2000 hours or more;

4: In the calcium-deposited area which was sealed with the film, the time to reach the area shrinkage of 5.0% from the peripheral region is 1000 hours or longer but less than 2000 hours;

3: In the calcium-deposited area which was sealed with the film, the time to reach the area shrinkage of 5.0% from the peripheral region is 500 hours or longer but less than 1000 hours;

2: In the calcium-deposited area which was sealed with the film, the time to reach the area shrinkage of 5.0% from the peripheral region is 100 hours or longer but less than 500 hours;

1: In the calcium-deposited area which was sealed with the film, the time to reach the area shrinkage of 5.0% from the peripheral region is less than 100 hours, or the presence or absence of the area shrinkage from the peripheral region cannot be determined as the corrosion progresses so rapidly.

2. Functional Film after Bending Resistance Test

The functional film was subjected to a bending durability test in which bending was repeated 100 times at an angle of 180 degrees to have curvature with radius of 6 mm. The functional film after the bending resistance test was also subjected to the evaluation of a water vapor barrier property, similar to the untreated functional film as described in above section 1.

(Evaluation of Organic EL Element)

The organic EL element produced was subjected to the following evaluation.

Evaluation of Uneven Light Emission

The organic EL element was applied with electric current under an environment of 60° C. and 90% RH, and then uneven light emission like an occurrence of dark spots or uneven brightness or the like was observed with a naked eye from Day 0 to Day 120. The evaluation of uneven light emission was performed according to the following criteria.

5: No dark spots or uneven brightness is observed on Day 0, and the non-light emitting region after 120 days is 1.0% or less of the entire light emitting region;

4: No dark spots or uneven brightness is observed on Day 0 and the non-light emitting region after 120 days is more than 1.0% but the same or less than 10.0% of the entire light emitting region, or dark spots or uneven brightness is observed on Day 0 in which the non-light emitting region is 1% or less and the non-light emitting region after 120 days is 1.0% or less of the entire light emitting region;

3: Dark spots or uneven brightness is observed on Day 0 in which the non-light emitting region is 1% or less, and the non-light emitting region after 120 days is more than 1.0% but the same or less than 10.0% of the entire light emitting region;

2: Dark spots or uneven brightness is observed on Day 0 in which the non-light emitting region is 1% or less and the non-light emitting region after 120 days is more than 10% of the entire light emitting region, or dark spots or uneven brightness is observed on Day 0 in which the non-light emitting region is more than 1% and the non-light emitting region after 120 days is more than 1.0% but the same or less than 10.0% of the entire light emitting region;

1: Dark spots or uneven brightness is observed on Day 0 in which the non-light emitting region is more than 1%, and the non-light emitting region after 120 days is more than 10% of the entire light emitting region.

Evaluation of Shrinkage in Peripheral Light Emitting Region

The organic EL element was applied with electric current under an environment of 40° C. and 90% RH, and then the non-light emitting region accompanied with the progress of corrosion from the peripheral part of the element sealed with the film (that is, level of shrinkage in light emitting region) was observed from Day 0 to Day 120 to perform the evaluation of shrinkage in peripheral light emitting region. The evaluation of shrinkage in peripheral light emitting region was performed according to the following criteria.

5: No shrinkage in the light emitting region is observed on Day 0, and the non-light emitting region after 120 days is 1.0% or less of the entire light emitting region;

4: No shrinkage in the light emitting region is observed on Day 0 and the non-light emitting region after 120 days is more than 1.0% but the same or less than 10.0% of the entire light emitting region, or the non-light emitting region on Day 0 is more than 0% but the same or less than 0.5% of the entire light emitting region and the non-light emitting region after 120 days is 1.0% or less of the entire light emitting region;

3: The non-light emitting region on Day 0 is more than 0% but the same or less than 0.5% of the entire light emitting region and the non-light emitting region after 120 days is more than 1.0% or less but the same or less than 10.0% of the entire light emitting region;

2: The non-light emitting region on Day 0 is more than 0% but the same or less than 0.5% of the entire light emitting region and the non-light emitting region after 120 days is more than 10% of the entire light emitting region, or the non-light emitting region on Day 0 is more than 0.5% of the entire light emitting region and the non-light emitting region after 120 days is more than 1.0% but the same or less than 10.0% of the entire light emitting region;

1: The non-light emitting region on Day 0 is more than 0.5% of the entire light emitting region and the non-light emitting region after 120 days is more than 10.0% of the entire light emitting region.

The evaluation results of the functional films of Examples 1 to 8 and Comparative Examples 1 to 9 and the organic EL elements that were produced by using them are shown in the following Table 5.

TABLE 5

| | Functional film | | | | Organic EL element | |
|---|---|---|---|---|---|---|
| | Untreated functional film | | Functional film after bending resistance test | | | |
| | Evaluation of propagation rate of corroded spots | Evaluation of peripheral shrinkage amount | Evaluation of propagation rate of corroded spots | Evaluation of peripheral shrinkage amount | Evaluation of uneven light emission | Evaluation of shrinkage in peripheral light emitting region |
| Example 1 | 4 | 4 | 3 | 3 | 4 | 4 |
| Example 2 | 3 | 3 | 3 | 3 | 3 | 3 |
| Example 3 | 4 | 3 | 4 | 3 | 4 | 3 |
| Example 4 | 5 | 5 | 4 | 4 | 5 | 5 |
| Example 5 | 5 | 5 | 5 | 5 | 5 | 5 |
| Example 6 | 4 | 4 | 3 | 3 | 4 | 4 |
| Example 7 | 3 | 3 | 3 | 3 | 3 | 3 |
| Example 8 | 4 | 3 | 4 | 3 | 4 | 3 |
| Comparative Example 1 | 1 | 1 | 1 | 1 | 1 | 1 |
| Comparative Example 2 | 2 | 2 | 2 | 2 | 2 | 2 |
| Comparative Example 3 | 2 | 2 | 2 | 2 | 2 | 2 |
| Comparative Example 4 | 1 | 1 | 1 | 1 | 1 | 1 |
| Comparative Example 5 | 1 | 1 | 1 | 1 | 1 | 1 |
| Comparative Example 6 | 1 | 1 | 1 | 1 | 1 | 1 |
| Comparative Example 7 | 1 | 1 | 1 | 1 | 1 | 1 |
| Comparative Example 8 | 1 | 1 | 1 | 1 | 1 | 1 |
| Comparative Example 9 | 1 | 1 | 1 | 1 | 1 | 1 |

As it is clearly shown in the results of Table 5, it is recognized that the functional film according to the present invention has excellent bending resistance and stability under high temperature and high humidity conditions. It is also recognized that the organic EL element using the functional film has excellent performances.

Further, each of the evaluation results of the functional films of Example 1 and Examples 9 to 25, Example 2 and Examples 26 to 32, and Example 3 and Example 33 to 49 and the organic EL elements that were produced by using them is shown in the following Tables 6 to 8.

TABLE 6

| | | Functional film | | | | Organic EL element | |
|---|---|---|---|---|---|---|---|
| | | Untreated functional film | | Functional film after bending resistance test | | | |
| | Film thickness ratio | Evaluation of propagation rate of corroded spots | Evaluation of peripheral shrinkage amount | Evaluation of propagation rate of corroded spots | Evaluation of peripheral shrinkage amount | Evaluation of uneven light emission | Evaluation of shrinkage in peripheral light emitting region |
| Example 1 | 0.3 | 4 | 4 | 3 | 3 | 4 | 4 |
| Example 9 | 0.5 | 4 | 4 | 4 | 3 | 4 | 4 |
| Example 10 | 0.6 | 4 | 4 | 4 | 3 | 4 | 4 |
| Example 11 | 0.7 | 4 | 4 | 3 | 3 | 4 | 4 |
| Example 12 | 1 | 4 | 4 | 3 | 3 | 4 | 4 |
| Example 13 | 1.1 | 4 | 4 | 3 | 3 | 3 | 3 |
| Example 14 | 0.09 | 4 | 4 | 3 | 3 | 3 | 3 |
| Example 15 | 0.009 | 3 | 3 | 3 | 3 | 3 | 3 |
| Example 16 | 0.06 | 4 | 4 | 3 | 3 | 3 | 3 |
| Example 17 | 0.1 | 4 | 4 | 4 | 3 | 4 | 4 |
| Example 18 | 0.12 | 4 | 4 | 4 | 3 | 4 | 4 |
| Example 19 | 0.96 | 4 | 4 | 3 | 3 | 4 | 4 |
| Example 20 | 0.009 | 3 | 3 | 3 | 3 | 3 | 3 |
| Example 21 | 0.06 | 4 | 4 | 3 | 3 | 3 | 3 |
| Example 22 | 0.09 | 4 | 4 | 3 | 3 | 3 | 3 |
| Example 23 | 0.1 | 4 | 4 | 4 | 3 | 4 | 4 |
| Example 24 | 0.9 | 4 | 4 | 4 | 3 | 4 | 4 |
| Example 25 | 1.1 | 4 | 4 | 3 | 3 | 3 | 3 |

TABLE 7

| | Film thickness ratio | Functional film | | | | Organic EL element | |
|---|---|---|---|---|---|---|---|
| | | Untreated functional film | | Untreated functional film | | | |
| | | Evaluation of propagation rate of corroded spots | Evaluation of peripheral shrinkage amount | Evaluation of propagation rate of corroded spots | Evaluation of peripheral shrinkage amount | Evaluation of uneven light emission | Evaluation of shrinkage in peripheral light emitting region |
| Example 2 | 0.3 | 3 | 3 | 3 | 3 | 3 | 3 |
| Example 26 | 0.5 | 4 | 4 | 3 | 3 | 3 | 3 |
| Example 27 | 0.6 | 4 | 4 | 3 | 3 | 3 | 3 |
| Example 28 | 0.7 | 3 | 3 | 3 | 3 | 3 | 3 |
| Example 29 | 1 | 3 | 3 | 3 | 3 | 3 | 3 |
| Example 30 | 1.1 | 3 | 3 | 3 | 2 | 3 | 3 |
| Example 31 | 0.09 | 3 | 3 | 3 | 3 | 3 | 2 |
| Example 32 | 0.009 | 3 | 3 | 3 | 2 | 3 | 2 |

TABLE 8

| | Film thickness ratio | Functional film | | | | Organic EL element | |
|---|---|---|---|---|---|---|---|
| | | Untreated functional film | | Untreated functional film | | | |
| | | Evaluation of propagation rate of corroded spots | Evaluation of peripheral shrinkage amount | Evaluation of propagation rate of corroded spots | Evaluation of peripheral shrinkage amount | Evaluation of uneven light emission | Evaluation of shrinkage in peripheral light emitting region |
| Example 3 | 0.3 | 4 | 3 | 4 | 3 | 4 | 3 |
| Example 33 | 0.5 | 4 | 4 | 4 | 3 | 4 | 3 |
| Example 34 | 0.6 | 4 | 4 | 4 | 3 | 4 | 3 |
| Example 35 | 0.7 | 4 | 3 | 4 | 3 | 4 | 3 |
| Example 36 | 1 | 4 | 3 | 4 | 3 | 4 | 3 |
| Example 37 | 1.1 | 4 | 4 | 3 | 3 | 4 | 3 |
| Example 38 | 0.09 | 4 | 4 | 3 | 3 | 4 | 3 |
| Example 39 | 0.009 | 4 | 3 | 3 | 3 | 3 | 3 |
| Example 40 | 0.06 | 4 | 4 | 3 | 3 | 3 | 3 |
| Example 41 | 0.1 | 4 | 4 | 4 | 3 | 4 | 3 |
| Example 42 | 0.12 | 4 | 4 | 4 | 3 | 4 | 3 |
| Example 43 | 0.96 | 4 | 4 | 4 | 3 | 4 | 3 |
| Example 44 | 0.009 | 4 | 3 | 3 | 3 | 3 | 3 |
| Example 45 | 0.06 | 4 | 4 | 3 | 3 | 4 | 3 |
| Example 46 | 0.09 | 4 | 4 | 3 | 3 | 4 | 3 |
| Example 47 | 0.1 | 4 | 4 | 4 | 3 | 4 | 3 |
| Example 48 | 0.9 | 4 | 4 | 4 | 3 | 4 | 3 |
| Example 49 | 1.1 | 4 | 4 | 3 | 3 | 4 | 3 |

As it is clearly shown in the results of Tables 6 to 8, for both cases in which the hybrid layer is present between the resin base and the functional inorganic layer or the hybrid layer is arranged on a surface of the functional inorganic layer, wherein the surface of the functional inorganic layer is opposite to the resin base, the gas barrier property, bending resistance, stability under high temperature and high humidity conditions, or the like are different depending on the ratio of film thickness (film thickness ratio) of the functional inorganic layer compared to the hybrid layer. It was found that an excellent gas barrier property, bending resistance, and stability under high temperature and high humidity conditions are obtained when the film thickness ratio is 0.01 to 2, in particular 0.1 to 1.0.

REFERENCE SIGNS LIST

11, 21, 31 Functional film,
12, 22, 32 Resin base,
13, 23, 33a, 33b Hybrid layer,
40 Organic EL panel,
41 Functional film,
42 Positive electrode,
43 Organic EL layer,
44 Negative electrode,
45 Adhesive layer,
46 Sealing member.

What is claimed is:

1. A functional film comprising:
   a resin base;
   a functional inorganic layer arranged on the resin base; and
   a hybrid layer arranged on at least one surface of the functional inorganic layer,
   wherein the hybrid layer comprises a polysiloxane and fine resin particles.

2. The functional film according to claim 1, wherein the hybrid layer is present between the resin base and the functional inorganic layer.

3. The functional film according to claim 1, wherein the hybrid layer is arranged on the surface of the functional inorganic layer opposite to the resin base.

4. The functional film according to claim 1, wherein the functional film has a functional inorganic layer produced by laminating two or more layers.

5. The functional film according to claim 1, wherein a ratio of a film thickness of the functional inorganic layer compared to a film thickness of the hybrid layer (film thickness of functional inorganic layer/film thickness of hybrid layer) is 0.001 to 10.

6. The functional film according to claim 1, wherein the functional film comprises, on both surfaces of the resin base, the functional inorganic layer and the hybrid layer arranged on at least one surface of the functional inorganic layer.

7. The functional film according to claim 1, wherein the functional inorganic layer is an inorganic layer with a gas barrier property.

8. An electronic device comprising a main body of the electronic device and the functional film according to claim 1.

9. The electronic device according to claim 8, wherein the main body of the electronic device is obtained by sealing with the functional film.

10. A method for producing a functional film comprising a resin base, a functional inorganic layer arranged on the resin base, and a hybrid layer arranged on at least one surface of the functional inorganic layer, the method comprising a step (1) of forming the hybrid layer by coating a first coating liquid comprising a polysiloxane and fine resin particles.

11. The production method according to claim 10, further comprising a step (2) of forming the functional inorganic layer by forming a coating film according to coating of a second coating liquid comprising an inorganic precursor and by performing a reforming treatment of the coating film.

12. The production method according to claim 11, wherein the inorganic precursor comprises a polysilazane.

13. The production method according to claim 11, wherein the reforming treatment is performed by vacuum ultraviolet ray irradiation.

14. An electronic device comprising a main body of the electronic device and the functional film produced by the method according to claim 10.

* * * * *